United States Patent
Li et al.

(10) Patent No.: US 9,156,678 B2
(45) Date of Patent: Oct. 13, 2015

(54) MEMS ENCAPSULATION BY MULTILAYER FILM LAMINATION

(71) Applicant: QUALCOMM MEMS Technologies, Inc., San Diego, CA (US)

(72) Inventors: Wenguang Li, Fremont, CA (US); Tsongming Kao, Sunnyvale, CA (US)

(73) Assignee: QUALCOMM MEMS Technologies, Inc., San Diego, CA (US)

( * ) Notice: Subject to any disclaimer, the term of this patent is extended or adjusted under 35 U.S.C. 154(b) by 42 days.

(21) Appl. No.: 14/104,915

(22) Filed: Dec. 12, 2013

(65) Prior Publication Data

US 2015/0166333 A1 Jun. 18, 2015

(51) Int. Cl.
  *H01L 23/20* (2006.01)
  *B81B 7/00* (2006.01)
  *B81C 1/00* (2006.01)

(52) U.S. Cl.
  CPC ........... *B81B 7/0058* (2013.01); *B81C 1/00333* (2013.01); *B81C 2203/0172* (2013.01)

(58) Field of Classification Search
  CPC ............ H01L 2924/1461; H01L 21/56; G02B 26/0833; G01C 19/5769
  USPC ......... 438/106, 107, 127, 50, 52, 53; 257/532
  See application file for complete search history.

(56) References Cited

U.S. PATENT DOCUMENTS

| | | | |
|---|---|---|---|
| 7,262,441 B2 | 8/2007 | Guenther et al. | |
| 8,040,587 B2 * | 10/2011 | Palmateer | 359/290 |
| 8,520,399 B2 | 8/2013 | Daniel | |
| 2003/0134961 A1 * | 7/2003 | Guo et al. | 524/492 |
| 2004/0012838 A1 * | 1/2004 | Huibers | 359/291 |
| 2007/0026559 A1 * | 2/2007 | Haluzak et al. | 438/50 |
| 2009/0267223 A1 | 10/2009 | Wachtler et al. | |
| 2010/0014162 A1 | 1/2010 | Bunde et al. | |
| 2010/0089636 A1 * | 4/2010 | Ramadas et al. | 174/521 |
| 2011/0132449 A1 | 6/2011 | Ramadas et al. | |
| 2011/0146398 A1 * | 6/2011 | Beck et al. | 73/204.27 |
| 2012/0091561 A1 * | 4/2012 | Van Velzen et al. | 257/532 |
| 2013/0082607 A1 * | 4/2013 | Gandhi et al. | 315/153 |
| 2013/0105921 A1 * | 5/2013 | Najafi et al. | 257/415 |
| 2013/0330878 A1 * | 12/2013 | Ararao | 438/107 |

FOREIGN PATENT DOCUMENTS

JP 2008137139 A 6/2008

\* cited by examiner

*Primary Examiner* — Bradley K Smith
*Assistant Examiner* — David Goodwin
(74) *Attorney, Agent, or Firm* — Weaver Austin Villeneuve & Sampson LLP

(57) ABSTRACT

This disclosure provides systems, methods and apparatus for a laminated film enclosing an array of microelectromechanical systems (MEMS) structures. In one aspect, a MEMS apparatus includes a substrate having a device region and an edge region surrounding the device region and an array of MEMS structures on the substrate at the device region. A protective layer is disposed over the array of MEMS structures. A laminated film is disposed over the protective layer and in contact with the substrate to form a seal at the edge region, where the laminated film forms a cavity between the substrate and the laminated film at the device region. The laminated film includes a moisture barrier layer facing away from the array of MEMS structures, and a desiccant layer facing toward the array of MEMS structures.

18 Claims, 11 Drawing Sheets

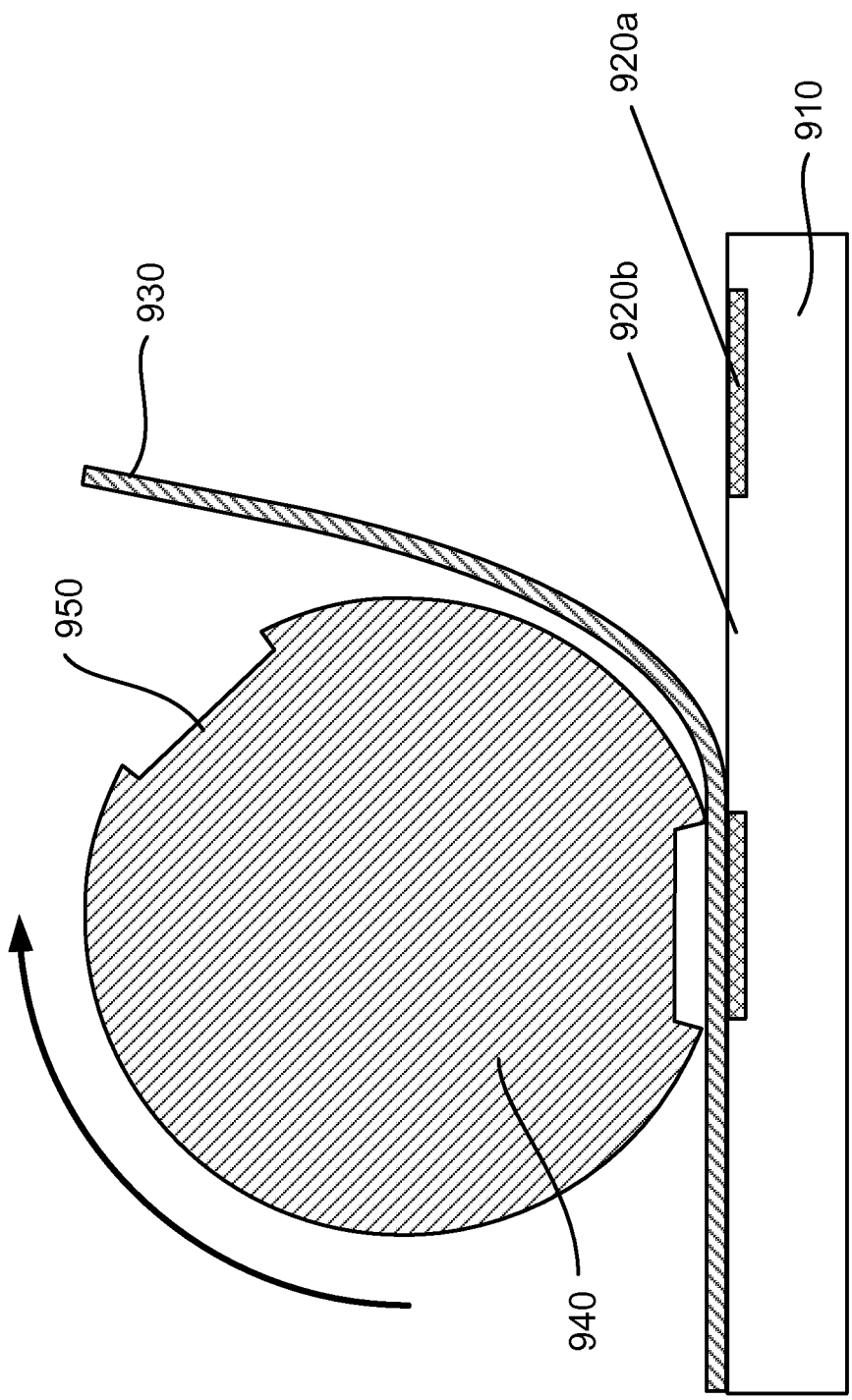

MEMS ENCAPSULATION BY MULTILAYER FILM LAMINATION

TECHNICAL FIELD

This disclosure relates to device packaging, and more particularly to device packaging of microelectromechanical systems and devices.

DESCRIPTION OF THE RELATED TECHNOLOGY

Electromechanical systems (EMS) include devices having electrical and mechanical elements, actuators, transducers, sensors, optical components such as mirrors and optical films, and electronics. EMS devices or elements can be manufactured at a variety of scales including, but not limited to, microscales and nanoscales. For example, microelectromechanical systems (MEMS) devices can include structures having sizes ranging from about a micron to hundreds of microns or more. Nanoelectromechanical systems (NEMS) devices can include structures having sizes smaller than a micron including, for example, sizes smaller than several hundred nanometers. Electromechanical elements may be created using deposition, etching, lithography, and/or other micromachining processes that etch away parts of substrates and/or deposited material layers, or that add layers to form electrical and electromechanical devices.

One type of EMS device is called an interferometric modulator (IMOD). The term IMOD or interferometric light modulator refers to a device that selectively absorbs and/or reflects light using the principles of optical interference. In some implementations, an IMOD display element may include a pair of conductive plates, one or both of which may be transparent and/or reflective, wholly or in part, and capable of relative motion upon application of an appropriate electrical signal. For example, one plate may include a stationary layer deposited over, on or supported by a substrate and the other plate may include a reflective membrane separated from the stationary layer by an air gap. The position of one plate in relation to another can change the optical interference of light incident on the IMOD display element. IMOD-based display devices have a wide range of applications, and are anticipated to be used in improving existing products and creating new products, especially those with display capabilities.

Packaging of EMS devices can protect the functional units of the device from the environment, provide mechanical support for the system components, provide an interface for electrical interconnections, and provide a specified atmosphere for device operation within the package.

SUMMARY

The systems, methods and devices of this disclosure each have several innovative aspects, no single one of which is solely responsible for the desirable attributes disclosed herein.

One innovative aspect of the subject matter described in this disclosure can be implemented in a microelectromechanical systems (MEMS) apparatus. The apparatus includes a substrate having a device region and an edge region surrounding the device region, an array of MEMS structures on the substrate at the device region, a protective layer over the array of MEMS structures, and a laminated film over the protective layer and in contact with the substrate to form a seal at the edge region. The laminated film forms a cavity between the substrate and the laminated film at the device region. The laminated film includes a moisture barrier layer facing away from the array of MEMS structures, and a desiccant layer facing toward the array of MEMS structures.

In some implementations, the apparatus can include an air gap, where the laminated film defines the air gap between the laminated film and the protective layer. In some implementations, the laminated film is directly on the protective layer. In some implementations, the desiccant layer extends continuously across the device region up to the edge region of the substrate. In some implementations, the laminated film has a thickness greater than about 30 microns at the device region of the substrate, and a thickness less than about 30 microns at the edge region of the substrate. In some implementations, the laminated film and the substrate enclose the array of MEMS structures to form a MEMS device package without a cover plate.

Another innovative aspect of the subject matter described in this disclosure can be implemented in a method of manufacturing a MEMS apparatus. The method includes providing a substrate, where the substrate includes a device region and an edge region surrounding the device region, providing an array of MEMS structures on the substrate at the device region, providing a protective layer over the array of MEMS structures, laminating a film over the protective layer and on the substrate to form a seal at the edge region, and forming a cavity between the substrate and the film at the device region upon laminating the film. The film includes a moisture barrier layer facing away from the array of MEMS structures, and a desiccant layer facing toward the array of MEMS structures.

Another innovative aspect of the subject matter described in this disclosure can be implemented in a MEMS apparatus. The apparatus includes a substrate having a device region and an edge region surrounding the device region, an array of MEMS structures on the substrate at the device region, means for protecting the MEMS structures over the array of MEMS structures, means for sealing by lamination over the protecting means and in contact with the substrate at the edge region. The sealing means forms a cavity between the sealing means and the substrate at the device region. The sealing means includes means for limiting passage of moisture facing away from the array of MEMS structures, means for removing moisture facing toward the array of MEMS structures.

In some implementations, the sealing means defines an air gap between the sealing means and the protecting means. In some implementations, the sealing means is directly on the protecting means.

Details of one or more implementations of the subject matter described in this disclosure are set forth in the accompanying drawings and the description below. Although the examples provided in this disclosure are primarily described in terms of EMS and MEMS-based displays the concepts provided herein may apply to other types of displays such as liquid crystal displays, organic light-emitting diode ("OLED") displays, and field emission displays. Other features, aspects, and advantages will become apparent from the description, the drawings and the claims. Note that the relative dimensions of the following figures may not be drawn to scale.

BRIEF DESCRIPTION OF THE DRAWINGS

FIG. 9A shows an example of a cross-sectional schematic illustration of a hot roll laminator for laminating a film over a MEMS array, according to some implementations.

Like reference numbers and designations in the various drawings indicate like elements.

DETAILED DESCRIPTION

Figure 1:
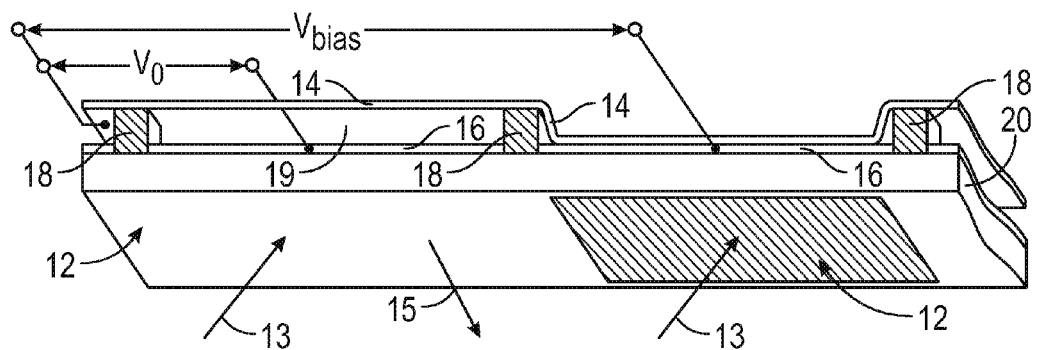
FIG. 1 is an isometric view illustration depicting two adjacent interferometric modulator (IMOD) display elements in a series or array of display elements of an IMOD display device.

The following description is directed to certain implementations for the purposes of describing the innovative aspects of this disclosure. However, a person having ordinary skill in the art will readily recognize that the teachings herein can be applied in a multitude of different ways. The described implementations may be implemented in any device, apparatus, or system that can be configured to display an image, whether in motion (such as video) or stationary (such as still images), and whether textual, graphical or pictorial. More particularly, it is contemplated that the described implementations may be included in or associated with a variety of electronic devices such as, but not limited to: mobile telephones, multimedia Internet enabled cellular telephones, mobile television receivers, wireless devices, smartphones, Bluetooth® devices, personal data assistants (PDAs), wireless electronic mail receivers, hand-held or portable computers, netbooks, notebooks, smartbooks, tablets, printers, copiers, scanners, facsimile devices, global positioning system (GPS) receivers/navigators, cameras, digital media players (such as MP3 players), camcorders, game consoles, wrist watches, clocks, calculators, television monitors, flat panel displays, electronic reading devices (e.g., e-readers), computer monitors, auto displays (including odometer and speedometer displays, etc.), cockpit controls and/or displays, camera view displays (such as the display of a rear view camera in a vehicle), electronic photographs, electronic billboards or signs, projectors, architectural structures, microwaves, refrigerators, stereo systems, cassette recorders or players, DVD players, CD players, VCRs, radios, portable memory chips, washers, dryers, washer/dryers, parking meters, packaging (such as in electromechanical systems (EMS) applications including microelectromechanical systems (MEMS) applications, as well as non-EMS applications), aesthetic structures (such as display of images on a piece of jewelry or clothing) and a variety of EMS devices. The teachings herein also can be used in non-display applications such as, but not limited to, electronic switching devices, radio frequency filters, sensors, accelerometers, gyroscopes, motion-sensing devices, magnetometers, inertial components for consumer electronics, parts of consumer electronics products, varactors, liquid crystal devices, electrophoretic devices, drive schemes, manufacturing processes and electronic test equipment. Thus, the teachings are not intended to be limited to the implementations depicted solely in the Figures, but instead have wide applicability as will be readily apparent to one having ordinary skill in the art.

For example, the disclosed implementations described herein relate to MEMS device packages and enclosing such packages using laminated films. A MEMS apparatus can include a substrate, an array of MEMS structures on the substrate, a protective layer over the array of MEMS structures, and a laminated film over the protective layer. The substrate can include a device region and an edge region surrounding the device region. The laminated film can contact the substrate to form a seal at the edge region of the substrate, and the laminated film can form a cavity between the substrate and the laminated film at the device region of the substrate. In some implementations, the laminated film can have multiple layers, including a moisture barrier layer facing away from the array of MEMS structures, and a desiccant layer facing toward the array of MEMS structures. The laminated film can enclose the MEMS apparatus to form a MEMS device package without using a cover plate or back plate, and without using thin film encapsulation.

In some implementations, the laminated film can be disposed over the protective layer to leave an air gap between the laminated film and the protective layer, or the laminated film can be disposed directly on the protective layer. If the laminated film is disposed directly on the protective layer, the laminated film can plug one or more holes in the protective layer. In some implementations, in addition to the moisture barrier layer and the desiccant layer, the laminated film can also include an adhesive layer facing toward the array of MEMS structures that has at least a portion in contact with the substrate at the edge region of the substrate. The properties of the laminated film can be chosen to have low outgassing and low permeability of water vapor. Furthermore, the thickness of the laminated film can be thicker at the device region than at the edge region of the substrate.

Particular implementations of the subject matter described in this disclosure can be implemented to realize one or more of the following potential advantages. Packaging an array of MEMS structures using a laminated film can achieve a relatively light weight and a small form factor. A small form factor can be advantageous for in-pixel device applications, such as display and imaging sensors. A small form factor also can be advantageous for on-panel or in-chip integrated solutions for interconnections between pixels and electronic components, such as thin film transistors (TFTs), storage capacitors, or resistors. Packaging an array of MEMS structures with lamination across a single substrate can lead to high throughput and avoid the use of costly materials and complex fabrication processes. Furthermore, the laminated film can occupy a relatively narrow space at the edge region of the device package to provide more usable area in the device package. The laminated film can have multiple layers, including a desiccant layer to absorb moisture. In some implementations, this may avoid having to place a desiccant along the edge region of the MEMS device package or elsewhere in the MEMS device package. In addition, the laminated film can have low outgassing to protect against contaminant gases and low permeability of water vapor to protect against moisture ingress.

An example of a suitable EMS or MEMS device or apparatus, to which the described implementations may apply, is a reflective display device. Reflective display devices can incorporate interferometric modulator (IMOD) display elements that can be implemented to selectively absorb and/or reflect light incident thereon using principles of optical interference. IMOD display elements can include a partial optical absorber, a reflector that is movable with respect to the absorber, and an optical resonant cavity defined between the absorber and the reflector. In some implementations, the reflector can be moved to two or more different positions, which can change the size of the optical resonant cavity and thereby affect the reflectance of the IMOD. The reflectance spectra of IMOD display elements can create fairly broad spectral bands that can be shifted across the visible wavelengths to generate different colors. The position of the spectral band can be adjusted by changing the thickness of the optical resonant cavity. One way of changing the optical resonant cavity is by changing the position of the reflector with respect to the absorber.

FIG. 1 is an isometric view illustration depicting two adjacent interferometric modulator (IMOD) display elements in a series or array of display elements of an IMOD display device. The IMOD display device includes one or more interferometric EMS, such as MEMS, display elements. In these devices, the interferometric MEMS display elements can be configured in either a bright or dark state. In the bright ("relaxed," "open" or "on," etc.) state, the display element reflects a large portion of incident visible light. Conversely, in the dark ("actuated," "closed" or "off," etc.) state, the display element reflects little incident visible light. MEMS display elements can be configured to reflect predominantly at particular wavelengths of light allowing for a color display in addition to black and white. In some implementations, by using multiple display elements, different intensities of color primaries and shades of gray can be achieved.

The IMOD display device can include an array of IMOD display elements which may be arranged in rows and columns. Each display element in the array can include at least a pair of reflective and semi-reflective layers, such as a movable reflective layer (i.e., a movable layer, also referred to as a mechanical layer) and a fixed partially reflective layer (i.e., a stationary layer), positioned at a variable and controllable distance from each other to form an air gap (also referred to as an optical gap, cavity or optical resonant cavity). The movable reflective layer may be moved between at least two positions. For example, in a first position, i.e., a relaxed position, the movable reflective layer can be positioned at a distance from the fixed partially reflective layer. In a second position, i.e., an actuated position, the movable reflective layer can be positioned more closely to the partially reflective layer. Incident light that reflects from the two layers can interfere constructively and/or destructively depending on the position of the movable reflective layer and the wavelength(s) of the incident light, producing either an overall reflective or non-reflective state for each display element. In some implementations, the display element may be in a reflective state when unactuated, reflecting light within the visible spectrum, and may be in a dark state when actuated, absorbing and/or destructively interfering light within the visible range. In some other implementations, however, an IMOD display element may be in a dark state when unactuated, and in a reflective state when actuated. In some implementations, the introduction of an applied voltage can drive the display elements to change states. In some other implementations, an applied charge can drive the display elements to change states.

The depicted portion of the array in FIG. 1 includes two adjacent interferometric MEMS display elements in the form of IMOD display elements 12. In the display element 12 on the right (as illustrated), the movable reflective layer 14 is illustrated in an actuated position near, adjacent or touching the optical stack 16. The voltage $V_{bias}$ applied across the display element 12 on the right is sufficient to move and also maintain the movable reflective layer 14 in the actuated position. In the display element 12 on the left (as illustrated), a movable reflective layer 14 is illustrated in a relaxed position at a distance (which may be predetermined based on design parameters) from an optical stack 16, which includes a partially reflective layer. The voltage $V_0$ applied across the display element 12 on the left is insufficient to cause actuation of the movable reflective layer 14 to an actuated position such as that of the display element 12 on the right.

In FIG. 1, the reflective properties of IMOD display elements 12 are generally illustrated with arrows indicating light 13 incident upon the IMOD display elements 12, and light 15 reflecting from the display element 12 on the left. Most of the light 13 incident upon the display elements 12 may be transmitted through the transparent substrate 20, toward the optical stack 16. A portion of the light incident upon the optical stack 16 may be transmitted through the partially reflective layer of the optical stack 16, and a portion will be reflected back through the transparent substrate 20. The portion of light 13 that is transmitted through the optical stack 16 may be reflected from the movable reflective layer 14, back toward (and through) the transparent substrate 20. Interference (constructive and/or destructive) between the light reflected from the partially reflective layer of the optical stack 16 and the light reflected from the movable reflective layer 14 will determine in part the intensity of wavelength(s) of light 15 reflected from the display element 12 on the viewing or substrate side of the device. In some implementations, the transparent substrate 20 can be a glass substrate (sometimes referred to as a glass plate or panel). The glass substrate may be or include, for example, a borosilicate glass, a soda lime glass, quartz, Pyrex, or other suitable glass material. In some implementations, the glass substrate may have a thickness of 0.3, 0.5 or 0.7 millimeters, although in some implementations the glass substrate can be thicker (such as tens of millimeters) or thinner (such as less than 0.3 millimeters). In some implementations, a non-glass substrate can be used, such as a polycarbonate, acrylic, polyethylene terephthalate (PET) or polyether ether ketone (PEEK) substrate. In such an implementation, the non-glass substrate will likely have a thickness of less than 0.7 millimeters, although the substrate may be thicker depending on the design considerations. In some implementations, a non-transparent substrate, such as a metal foil or stainless steel-based substrate can be used. For example, a reverse-IMOD-based display, which includes a fixed reflective layer and a movable layer which is partially transmissive and partially reflective, may be configured to be viewed from the opposite side of a substrate as the display elements 12 of FIG. 1 and may be supported by a non-transparent substrate.

The optical stack 16 can include a single layer or several layers. The layer(s) can include one or more of an electrode layer, a partially reflective and partially transmissive layer, and a transparent dielectric layer. In some implementations, the optical stack 16 is electrically conductive, partially transparent and partially reflective, and may be fabricated, for example, by depositing one or more of the above layers onto a transparent substrate 20. The electrode layer can be formed from a variety of materials, such as various metals, for example indium tin oxide (ITO). The partially reflective layer can be formed from a variety of materials that are partially reflective, such as various metals (e.g., chromium and/or molybdenum), semiconductors, and dielectrics. The partially reflective layer can be formed of one or more layers of materials, and each of the layers can be formed of a single material or a combination of materials. In some implementations, certain portions of the optical stack 16 can include a single semi-transparent thickness of metal or semiconductor which serves as both a partial optical absorber and electrical conductor, while different, electrically more conductive layers or portions (e.g., of the optical stack 16 or of other structures of the display element) can serve to bus signals between IMOD display elements. The optical stack 16 also can include one or more insulating or dielectric layers covering one or more conductive layers or an electrically conductive/partially absorptive layer.

In some implementations, at least some of the layer(s) of the optical stack 16 can be patterned into parallel strips, and may form row electrodes in a display device as described further below. As will be understood by one having ordinary skill in the art, the term "patterned" is used herein to refer to masking as well as etching processes. In some implementations, a highly conductive and reflective material, such as aluminum (Al), may be used for the movable reflective layer 14, and these strips may form column electrodes in a display device. The movable reflective layer 14 may be formed as a series of parallel strips of a deposited metal layer or layers (orthogonal to the row electrodes of the optical stack 16) to form columns deposited on top of supports, such as the illustrated posts 18, and an intervening sacrificial material located between the posts 18. When the sacrificial material is etched away, a defined gap 19, or optical cavity, can be formed between the movable reflective layer 14 and the optical stack 16. In some implementations, the spacing between posts 18 may be approximately 1-1000 µm, while the gap 19 may be approximately less than 10,000 Angstroms (Å).

In some implementations, each IMOD display element, whether in the actuated or relaxed state, can be considered as a capacitor formed by the fixed and moving reflective layers. When no voltage is applied, the movable reflective layer 14 remains in a mechanically relaxed state, as illustrated by the display element 12 on the left in FIG. 1, with the gap 19 between the movable reflective layer 14 and optical stack 16. However, when a potential difference, i.e., a voltage, is applied to at least one of a selected row and column, the capacitor formed at the intersection of the row and column electrodes at the corresponding display element becomes charged, and electrostatic forces pull the electrodes together. If the applied voltage exceeds a threshold, the movable reflective layer 14 can deform and move near or against the optical stack 16. A dielectric layer (not shown) within the optical stack 16 may prevent shorting and control the separation distance between the layers 14 and 16, as illustrated by the actuated display element 12 on the right in FIG. 1. The behavior can be the same regardless of the polarity of the applied potential difference. Though a series of display elements in an array may be referred to in some instances as "rows" or "columns," a person having ordinary skill in the art will readily understand that referring to one direction as a "row" and another as a "column" is arbitrary. Restated, in some orientations, the rows can be considered columns, and the columns considered to be rows. In some implementations, the rows may be referred to as "common" lines and the columns may be referred to as "segment" lines, or vice versa. Furthermore, the display elements may be evenly arranged in orthogonal rows and columns (an "array"), or arranged in non-linear configurations, for example, having certain positional offsets with respect to one another (a "mosaic"). The terms "array" and "mosaic" may refer to either configuration. Thus, although the display is referred to as including an "array" or "mosaic," the elements themselves need not be arranged orthogonally to one another, or disposed in an even distribution, in any instance, but may include arrangements having asymmetric shapes and unevenly distributed elements.

Figure 2:
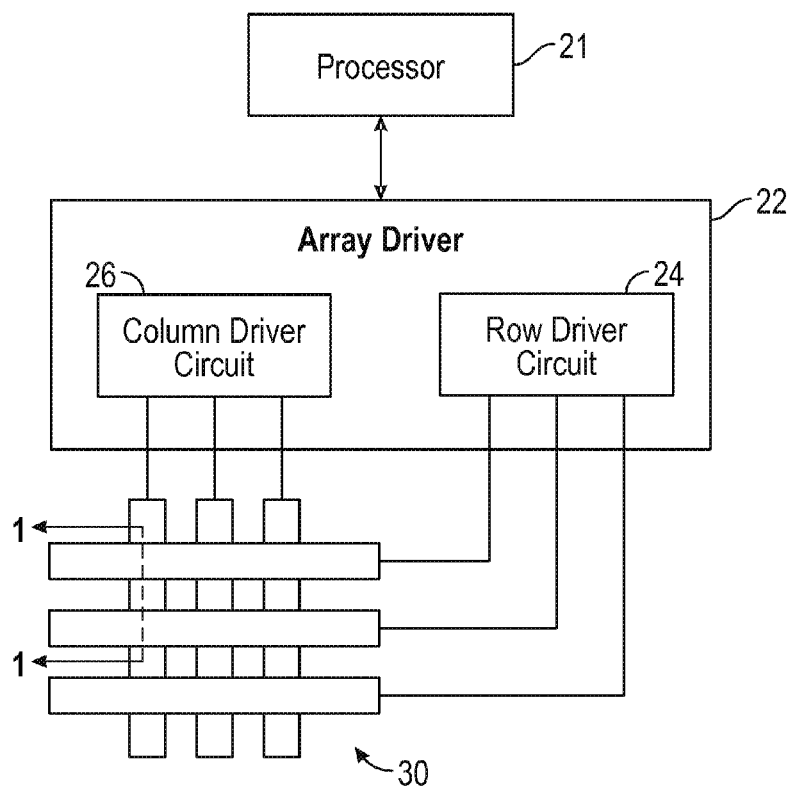
FIG. 2 is a system block diagram illustrating an electronic device incorporating an IMOD-based display including a three element by three element array of IMOD display elements.

FIG. 2 is a system block diagram illustrating an electronic device incorporating an IMOD-based display including a three element by three element array of IMOD display elements. The electronic device includes a processor 21 that may be configured to execute one or more software modules. In addition to executing an operating system, the processor 21 may be configured to execute one or more software applications, including a web browser, a telephone application, an email program, or any other software application.

The processor 21 can be configured to communicate with an array driver 22. The array driver 22 can include a row driver circuit 24 and a column driver circuit 26 that provide signals to, for example a display array or panel 30. The cross section of the IMOD display device illustrated in FIG. 1 is shown by the lines 1-1 in FIG. 2. Although FIG. 2 illustrates a 3×3 array of IMOD display elements for the sake of clarity, the display array 30 may contain a very large number of IMOD display elements, and may have a different number of IMOD display elements in rows than in columns, and vice versa.

Figure 3A:
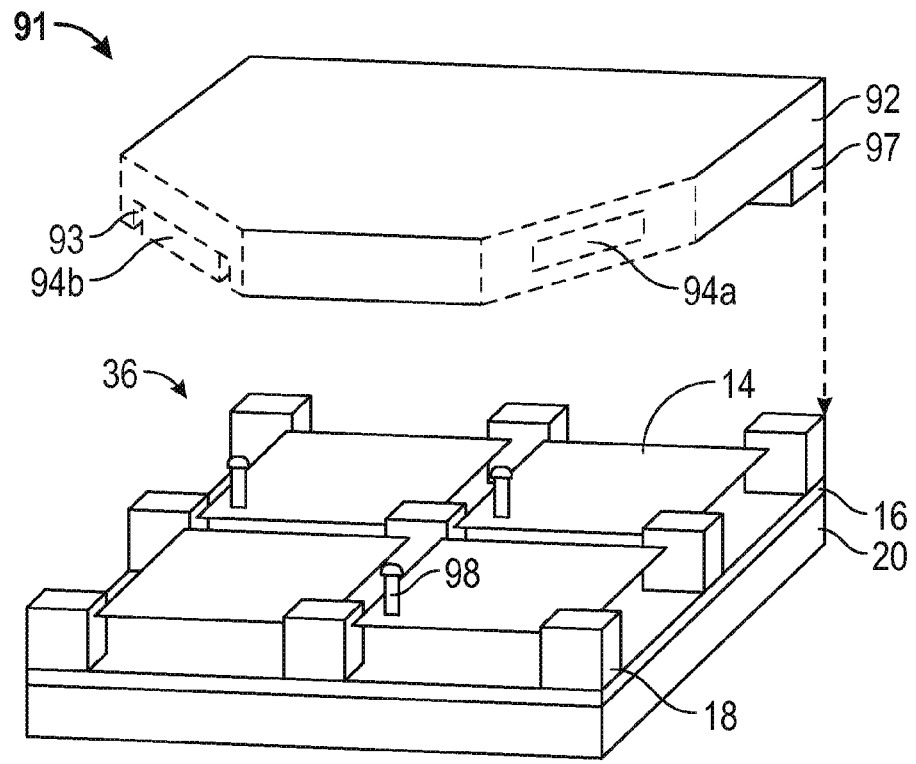
FIGS. 3A and 3B are schematic exploded partial perspective views of a portion of an electromechanical systems (EMS) package including an array of EMS elements and a backplate.
Figure 3B:
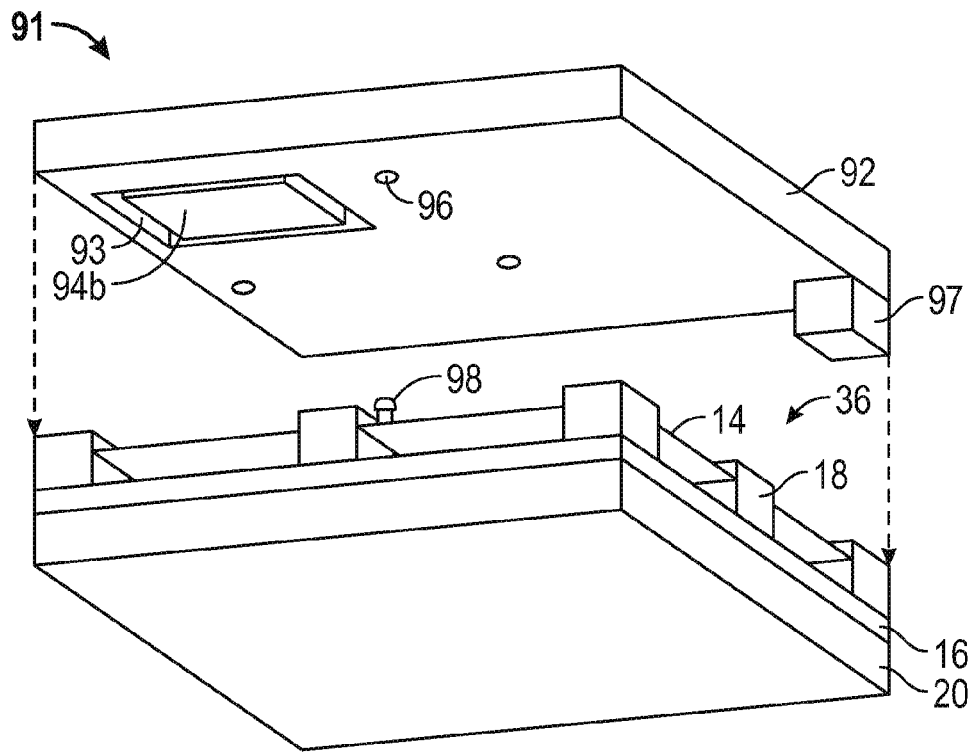

FIGS. 3A and 3B are schematic exploded partial perspective views of a portion of an EMS package 91 including an array 36 of EMS elements and a backplate 92. FIG. 3A is shown with two corners of the backplate 92 cut away to better illustrate certain portions of the backplate 92, while FIG. 3B is shown without the corners cut away. The EMS array 36 can include a substrate 20, support posts 18, and a movable layer 14. In some implementations, the EMS array 36 can include an array of IMOD display elements with one or more optical stack portions 16 on a transparent substrate, and the movable layer 14 can be implemented as a movable reflective layer.

The backplate 92 can be essentially planar or can have at least one contoured surface (e.g., the backplate 92 can be formed with recesses and/or protrusions). The backplate 92 may be made of any suitable material, whether transparent or opaque, conductive or insulating. Suitable materials for the backplate 92 include, but are not limited to, glass, plastic, ceramics, polymers, laminates, metals, metal foils, Kovar and plated Kovar.

As shown in FIGS. 3A and 3B, the backplate 92 can include one or more backplate components 94a and 94b, which can be partially or wholly embedded in the backplate 92. As can be seen in FIG. 3A, backplate component 94a is embedded in the backplate 92. As can be seen in FIGS. 3A and 3B, backplate component 94b is disposed within a recess 93 formed in a surface of the backplate 92. In some implementations, the backplate components 94a and/or 94b can protrude from a surface of the backplate 92. Although backplate component 94b is disposed on the side of the backplate 92 facing the substrate 20, in other implementations, the backplate components can be disposed on the opposite side of the backplate 92.

The backplate components 94a and/or 94b can include one or more active or passive electrical components, such as transistors, capacitors, inductors, resistors, diodes, switches, and/or integrated circuits (ICs) such as a packaged, standard or discrete IC. Other examples of backplate components that can be used in various implementations include antennas, batteries, and sensors such as electrical, touch, optical, or chemical sensors, or thin-film deposited devices.

In some implementations, the backplate components 94a and/or 94b can be in electrical communication with portions of the EMS array 36. Conductive structures such as traces, bumps, posts, or vias may be formed on one or both of the backplate 92 or the substrate 20 and may contact one another or other conductive components to form electrical connections between the EMS array 36 and the backplate components 94a and/or 94b. For example, FIG. 3B includes one or more conductive vias 96 on the backplate 92 which can be aligned with electrical contacts 98 extending upward from the movable layers 14 within the EMS array 36. In some implementations, the backplate 92 also can include one or more insulating layers that electrically insulate the backplate components 94a and/or 94b from other components of the EMS array 36. In some implementations in which the backplate 92 is formed from vapor-permeable materials, an interior surface of backplate 92 can be coated with a vapor barrier (not shown).

The backplate components 94a and 94b can include one or more desiccants which act to absorb any moisture that may enter the EMS package 91. In some implementations, a desiccant (or other moisture absorbing materials, such as a getter) may be provided separately from any other backplate components, for example as a sheet that is mounted to the backplate 92 (or in a recess formed therein) with adhesive. Alternatively, the desiccant may be integrated into the backplate 92. In some other implementations, the desiccant may be applied directly or indirectly over other backplate components, for example by spray-coating, screen printing, or any other suitable method.

In some implementations, the EMS array 36 and/or the backplate 92 can include mechanical standoffs 97 to maintain a distance between the backplate components and the display elements and thereby prevent mechanical interference between those components. In the implementation illustrated in FIGS. 3A and 3B, the mechanical standoffs 97 are formed as posts protruding from the backplate 92 in alignment with the support posts 18 of the EMS array 36. Alternatively or in addition, mechanical standoffs, such as rails or posts, can be provided along the edges of the EMS package 91.

Although not illustrated in FIGS. 3A and 3B, a seal can be provided which partially or completely encircles the EMS array 36. Together with the backplate 92 and the substrate 20, the seal can form a protective cavity enclosing the EMS array 36. The seal may be a semi-hermetic seal, such as a conventional epoxy-based adhesive. In some other implementations, the seal may be a hermetic seal, such as a thin film metal weld or a glass frit. In some other implementations, the seal may include polyisobutylene (PIB), polyurethane, liquid spin-on glass, solder, polymers, plastics, or other materials. In some implementations, a reinforced sealant can be used to form mechanical standoffs.

In alternate implementations, a seal ring may include an extension of either one or both of the backplate 92 or the substrate 20. For example, the seal ring may include a mechanical extension (not shown) of the backplate 92. In some implementations, the seal ring may include a separate member, such as an O-ring or other annular member.

In some implementations, the EMS array 36 and the backplate 92 are separately formed before being attached or coupled together. For example, the edge of the substrate 20 can be attached and sealed to the edge of the backplate 92 as discussed above. Alternatively, the EMS array 36 and the backplate 92 can be formed and joined together as the EMS package 91. In some other implementations, the EMS package 91 can be fabricated in any other suitable manner, such as by forming components of the backplate 92 over the EMS array 36 by deposition.

MEMS and other EMS structures can be packaged to withstand environmental forces and to limit the ingress of moisture and other environmental agents. The MEMS structures may have elements that are sensitive to various environmental factors, including temperature, pressure, humidity, contaminants, vibration, and impact. For example, ingress of moisture into a MEMS device can introduce "stiction," which can refer to the tendency of a movable layer to stick to a substrate or stationary layer in a MEMS device. This can be a significant reliability concern for a MEMS device. A MEMS device can be protected from ingress of moisture by use of a hermetic seal or otherwise applying materials with a low permeability of water vapor. While the below description refers to packaging MEMS devices, various implementations include packaging other types of EMS structures and packages including other types of EMS structures.

Some MEMS devices may be sealed in a device package by applying a sealant between a substrate and a cover plate or back plate. However, use of a sealant and a cover plate can lead to device packages that are relatively thick and heavy. Sealant along the edges of the device package can lead to undesirably thick borders. Furthermore, device packages manufactured in such a manner may have low throughput, use materials that are relatively expensive, have insufficient mechanical strength, have too high outgassing, and/or be too permeable to moisture ingress.

Some MEMS devices may be sealed in a device package by applying a hermetic thin film encapsulation. However, device packages manufactured in such a manner may have low throughput and are manufactured by processes that are relatively costly, such as physical vapor deposition (PVD), chemical vapor deposition (CVD), spin-coating, and/or curing processes.

MEMS devices or MEMS structures may be arranged in an apparatus or device package as an array. An apparatus can include an array of a plurality of MEMS structures. For example, a display can include a pixel array that includes a number of pixel devices, such as MEMS structures, including IMODs. Other components can be included, such as matrixed active switches and drivers, as well as passive devices such as storage/sensing capacitors and resistors.

An apparatus can include an array of MEMS structures that can be sealed in a device package that protects against environmental agents and external forces while achieving a relatively high throughput, low cost, light weight, narrow border, and thin form factor. In addition, the device package can be sealed without using a cover plate or back plate, and without using thin film encapsulation.

Figure 4:
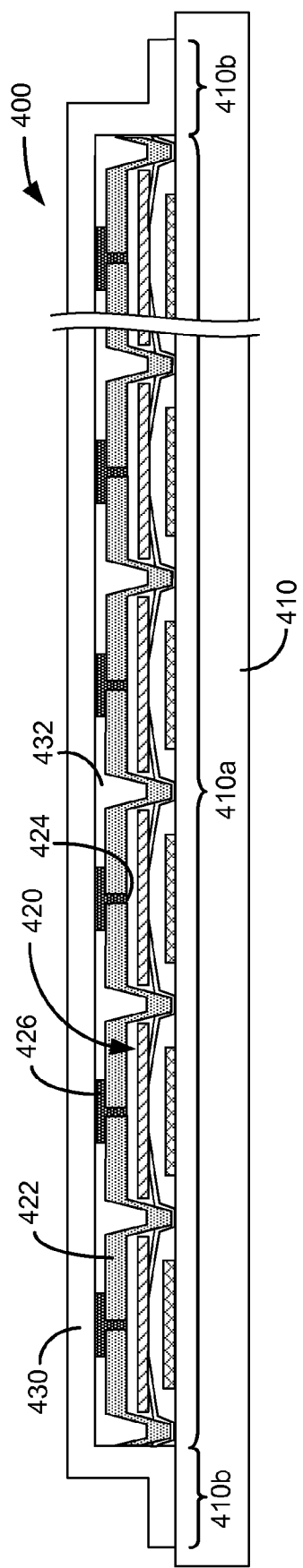
FIG. 4 shows an example of a cross-sectional schematic illustration of a MEMS apparatus with an array of MEMS structures.

FIG. 4 shows an example of a cross-sectional schematic illustration of a MEMS apparatus with an array of MEMS structures. A MEMS apparatus 400 can include a substrate 410, an array of MEMS structures 420 on the substrate 410, and a laminated film 430 over the array of MEMS structures 420. The laminated film 430 can form a seal between the substrate 410 and the laminated film 430 to enclose the array of MEMS structures 420.

In some implementations, the substrate 410 can be made of any number of different substrate materials, including transparent and non-transparent materials. For example, the substrate 410 can be a transparent substrate made of a glass, plastic, or other transparent material. Glass substrates (sometimes referred to as glass plates or panels) may be or include a borosilicate glass, a soda lime glass, photoglass, quartz, Pyrex, or other suitable glass material. A non-glass substrate can be used, such as a polycarbonate, acrylic, polyethylene terephthalate (PET), or polyether ether ketone (PEEK) substrate. In some implementations, the substrate 410 can have a thickness between about 10 microns and about 1100 microns. The thickness of the substrate 410 can vary according to implementation.

A plurality of MEMS structures 420 can be arranged in an array on the substrate 410. Each of the MEMS structures 420 can include electrical, optical, and mechanically moving parts that may be vulnerable to environmental agents and external forces. A protective layer 422 can be disposed over the MEMS structures 420 in the array. In some implementations, the protective layer 422 can be relatively thick, such as greater than about 1 to 3 microns, and can include a dielectric material. Thicker protective layers are also possible. In some implementations, the protective layer 422 is a stack of layers which may include a first dielectric layer (for example, 0.5 to 2.0 microns thick), a metal film (for example, 0.5 microns thick) over the first dielectric, and a second dielectric layer over the metal film (for example, 0.5 to 2.0 microns thick). The protective layer 422 can include one or more holes 424. The one or more holes 424 may be release holes that provide a passage for etchants to pass through and allow one or more sacrificial layers to be etched. The one or more holes 424 can be subsequently plugged or sealed. In some implementations, the protective layer 422 further includes an optional cap 426 to plug the one or more holes 424. For example, the cap 426 can be made by defining a solder ring around the hole 424 and reflowing the solder to collapse and plug the hole 424. In some implementations, the hole is "plugged" or "sealed" using the laminated film 430. Examples of the MEMS structure 420 and the protective layer 422 are described in more detail below with respect to FIG. 5.

The laminated film 430 can be disposed over the protective layer 422 and, hence, over the array of MEMS structures 420. In some implementations, the laminated film 430 may be laminated directly on the protective layer 422 and cover the one or more holes 424. In some implementations, the laminated film 430 may be laminated to define an air gap 432 between the laminated film 430 and the protective layer 422, thereby creating an "air bubble." As illustrated in the example in FIG. 4, the laminated film 430 may be laminated over the cap 426 to define the air gap 432 between the laminated film 430 and the protective layer 422. In some implementations without cap 426, the laminated film 430 is in direct contact with the protective layer 422, and seals the holes 424 in the protective layer 422. In implementations with an air bubble, the holes 424 may be left unplugged.

The substrate 410 may include a device region 410a and an edge region 410b surrounding the device region 410a. The array of MEMS structures 420 may be disposed in the device region 410a. The laminated film 430 in contact with the substrate 410 can form a seal in the edge region 410b of the substrate 410. The laminated film 430 encloses the array of MEMS structures 420 to form a MEMS device package. In some implementations, the laminated film 430 provides a back cover for a display device and the substrate 410 provides a front cover for the display device.

In some implementations, an external force, such as a finger touch, can apply pressure to the laminated film 430. The external force can be applied to any part of the MEMS apparatus 400, including the substrate 410. The external force applied to the substrate 410 may press the protective layer 422 over the MEMS structures 420 against the laminated film 430. In some implementations, the external force may be applied directly against to laminated film 430 to compress the laminated film 430. The laminated film 430 may be able to resist the external force, but if the external force increases beyond a certain threshold, the laminated film 430 may not be able to withstand the external force to sufficiently protect the array of MEMS structures 420. Compression of the laminated film 430 may cause damage to one or more parts of any of the MEMS structures 420. However, certain design variables in the MEMS apparatus 400 can be configured to further protect the array of MEMS structures 420, such as configuring the density of the array of MEMS structures 420, the thickness of the protective layer 422 and/or the thickness of the cap 426.

The ability of the MEMS apparatus 400 to resist external forces can depend on a density of the array of MEMS structures 420. The denser the array of MEMS structures 420, the more the external forces can be distributed across the array of MEMS structures 420, and the more the array of MEMS structures 420 can withstand the external forces. The density of the array of MEMS structures 420 can be tuned by adjusting a pitch of the array of MEMS structures 420. In some implementations, the pitch between each of the MEMS structures 420 can be between about 20 microns and about 80 microns. The pitch can refer to a center-to-center distance between each of the MEMS structures. Accordingly, a smaller pitch between each of the MEMS structures 420 can improve the resistance to external pressure of the MEMS apparatus 400.

The resistance to external forces of the MEMS apparatus 400 can be further increased by adjusting the thickness of the protective layer 422. In some implementations, the thickness of the protective layer 422 can be greater than about 3 microns.

Figure 5:
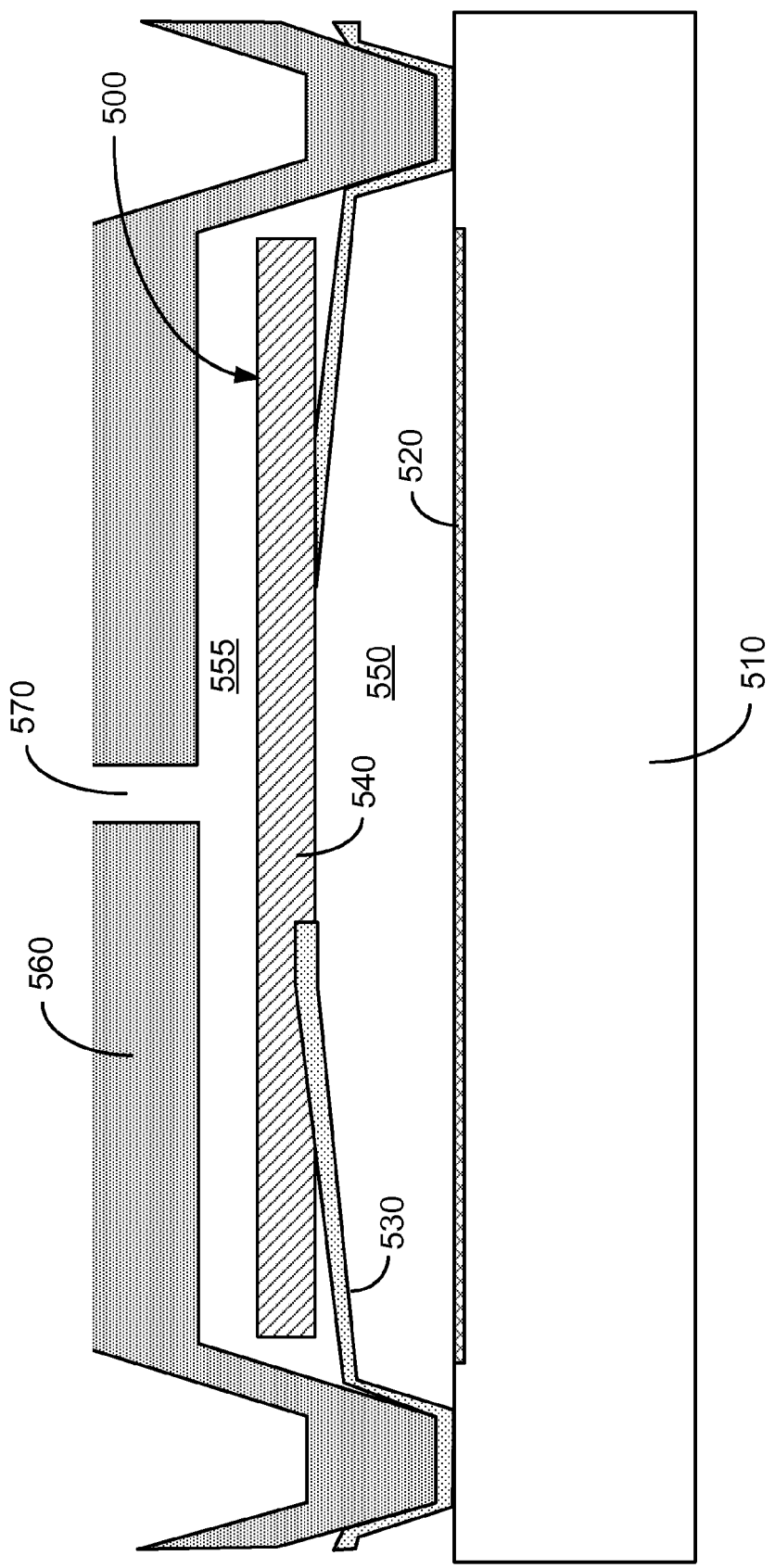
FIG. 5 shows an example of a cross-sectional schematic illustration of a MEMS structure on a substrate.

FIG. 5 shows an example of a cross-sectional schematic illustration of a MEMS structure on a substrate. A MEMS structure 500 can include a stationary electrode 520 over the substrate 510 and a movable electrode 540 over the stationary electrode 520, where the stationary electrode 520 and the movable electrode 540 define a gap 550 therebetween. Hinges or tethers 530 may be disposed between the movable electrode 540 and the substrate 510 to support the movable electrode 540. In some implementations, the MEMS structure 500 can be an IMOD, such as an analog or multi-state IMOD.

A protective layer 560 may be positioned over the MEMS structure 500, where the protective layer 560 may have a hole 570. The hole 570 may be a release hole to provide a passageway for etchant to remove sacrificial material. Removal of sacrificial material results in formation of the gap 550. The protective layer 560 may be formed on a portion of the tethers 530 and extend over the movable electrode 540.

In some implementations, the gap 550 may further include a space 555 between the movable electrode 540 and the protective layer 560. The movable electrode 540 may be configured to move across the gap 550 toward the stationary electrode 520. In some implementations, the movable electrode 540 may also be configured to move across the space 555 toward the protective layer 560. The movable electrode 540 may actuate toward the protective layer 560 or the stationary electrode 520 by electrostatic forces of attraction.

In some implementations, the stationary electrode 520 may be part of an optical stack, where the optical stack can be electrically conductive or include an electrically conductive layer. The optical stack can also be at least partially absorbing of visible light or include an optically absorbing material. In some implementations, the stationary electrode 520 can include an optically absorbing material that is also electrically conductive. The absorbing material can have a thickness between about 20 Å and about 100 Å, and can be made of electrically conductive material such as molybdenum-chromium (MoCr).

The movable electrode 540 may be electrically conductive or include an electrically conductive layer. In some implementations, the movable electrode may include one or more layers, such as a reflective layer. The reflective layer itself can include one or more sub-layers, such as a dielectric sub-layer and a metal sub-layer. The dielectric sub-layer can provide structural rigidity to the movable electrode 540 and can be made of dielectric materials such as nitrous oxide, silicon dioxide, silicon oxynitride, and silicon nitride. The metal sub-layer can be made of aluminum, copper, aluminum-copper alloy, or other electrically conductive material and have a thickness between about 100 Å and about 500 Å. In some implementations, the reflective layer can provide a mirror for interferometrically modulating light with the optically absorbing material in the stationary electrode 520.

The hinges or tethers 530 may be able to bend or otherwise deform to allow the movable electrode 540 to actuate toward the stationary electrode 520 or the protective layer 560. The movable electrode 540 may remain substantially parallel to the stationary electrode 520 or the protective layer 560 during actuation. The tethers 530 may be symmetrically disposed around the movable electrode 540. In some implementations, the tethers 530 can be made of metals such as aluminum and titanium, or other materials such as silicon, oxides, nitrides, and oxynitrides.

The gap distance between the movable electrode 540 and the stationary electrode 520 may influence the reflective properties of the MEMS structure 500. In some implementations, the movable electrode 540 can move to three or more positions across the gap 550. Depending on the position of the movable electrode 540, different wavelengths of light can be reflected back through the substrate 510, which can give the appearance of different colors. For example, the movable electrode 540 can be configured to reflect a color within the red-green-blue color spectrum. When a voltage is applied to either the electrode in the protective layer 560 or the electrode in the stationary electrode 520, the movable electrode 540 may move to different positions toward either the protective layer 560 or the stationary electrode 520. In some implementations, the MEMS structure 500 may be a three-terminal device, meaning that the MEMS structure 500 can be provided with an electrode in each of the stationary electrode 520, the movable electrode 540, and the protective layer 560.

The protective layer 560 can provide structurally rigid protection for the MEMS structure 500 and can include one or more dielectric materials. For example, the protective layer 560 can include silicon dioxide, silicon nitride, silicon oxynitride, or other suitable dielectric material. The protective layer 560 can include one or more layers, including an electrically conductive layer. The electrically conductive layer can include a metal, such as aluminum-copper. In some implementations, the protective layer 560 can be relatively thick, such as greater than about 1 micron, greater than about 3 microns, between about 1 micron and about 3 microns, or between about 3 microns and about 10 microns.

Figure 6A:
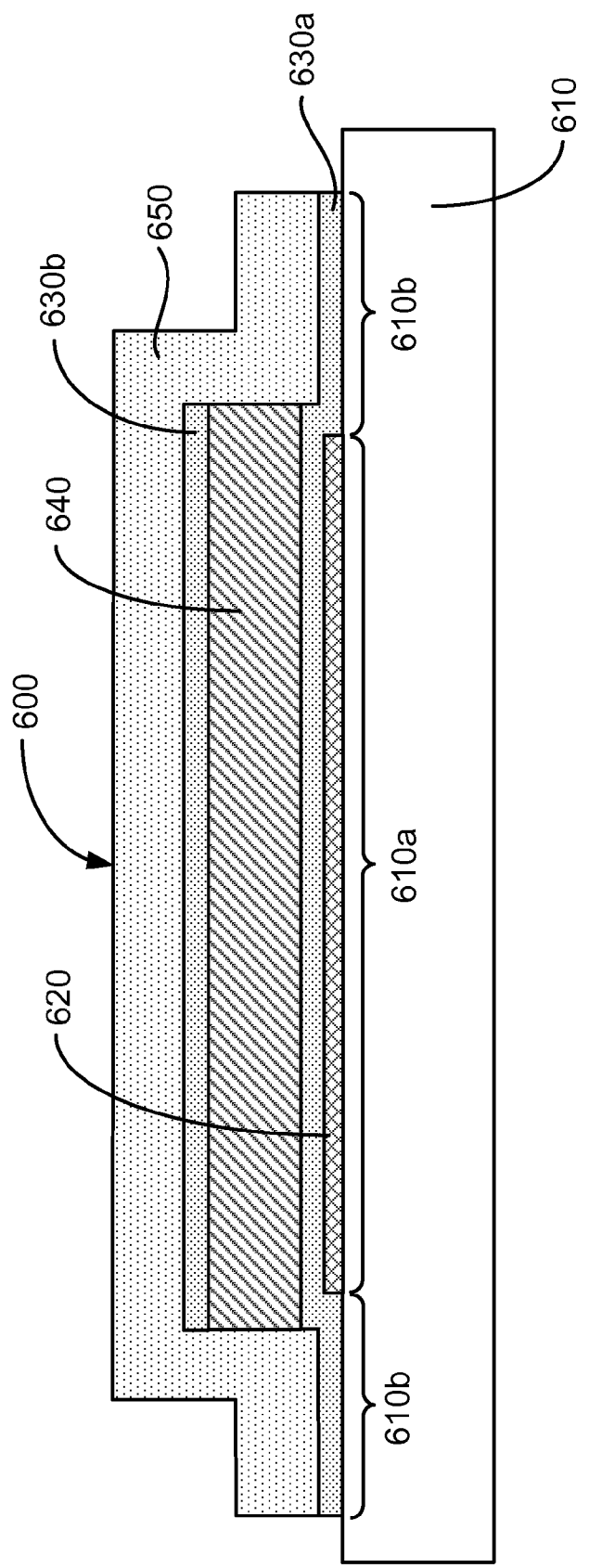
FIG. 6A shows an example of a cross-sectional schematic illustration of a multilayer laminated film on a MEMS array.

FIG. 6A shows an example of a cross-sectional schematic illustration of a multilayer laminated film on a MEMS array. A laminated film 600 can include a plurality of layers, including a moisture barrier layer 650 and a desiccant layer 640. The moisture barrier layer 650 can be facing away from an array MEMS structures 620 on a substrate 610, so that the moisture barrier layer 650 can be exposed to the ambient environment. The desiccant layer 640 can be facing toward the array of MEMS structures 620 on the substrate 610. In some implementations, the laminated film 600 further includes one or more adhesive layers 630a and/or 630b. A first adhesive layer 630a may be between the substrate 610 and the desiccant layer 640, and a second adhesive layer 630b may be between the desiccant layer 640 and the moisture barrier layer 650. Hence, the desiccant layer 640 may be sandwiched between two adhesive layers 630a and 630b. Portions of the first adhesive layer 630a may be in contact with the substrate 610.

In some implementations, the moisture barrier layer 650 can include an inorganic material, such as a metal or metal foil. For example, the moisture barrier layer 650 can be made of aluminum. Because metal is generally impervious to water, the moisture barrier layer 650 can be positioned to face the external ambient environment. In some implementations, the moisture barrier layer 650 can be greater than about 1 micron, such as between about 1 micron and about 30 microns, or such as between about 10 microns and about 30 microns.

In some implementations, the desiccant layer 640 can be made of any suitable desiccant material, including calcium oxide, strontium oxide, silica gels, montmorillonite clay, molecular sieves, zeolites, or calcium sulfates. In some implementations, the desiccant layer 640 may be positioned over a device region 610a and extend continuously across the device region 610a up to the edge region 610b of the substrate 610. The desiccant layer 640 does not cover the edge region 610b where the seal is formed with the substrate 610. Thus, the laminated film 600 does not include a desiccant or desiccant layer at the edge region 610b of the substrate 610. The desiccant layer 640 may absorb moisture and contaminant gases to reduce the ingress of such substances into the array of MEMS structures 620. As illustrated in the example in FIG. 6A, any moisture and contaminant gases entering between the moisture barrier layer 650 and the substrate 610 from the edge region 610b toward the device region 610a may be absorbed by the desiccant layer 640. Thus, moisture and contaminant gases may be absorbed by the desiccant layer 640 at the interface between the first adhesive layer 630a and the array of MEMS structures 620.

In some implementations, the one or more adhesive layers 630a and/or 630b can be selected for its mechanical strength, resistance against heat, resistance against moisture, and resistance to outgassing. In some implementations, the one or more adhesive layers 630a and/or 630b may be selected for its ability to adhere on glass. The one or more adhesive layers 630a and/or 630b can also be selected for its ability to contain the desiccant layer 640. The one or more adhesive layers 630a and/or 630b can also be selected with a relatively low permeability to water vapor and low outgassing. For example, the one or more adhesive layers 630a and/or 630b can include Tyvek® (DuPont Corporation) or polyethylene. Other adhesives can include one-part or two-part epoxies, polyurethane, hot-melt adhesives (HMA), and one-part or two-part acrylates. In some implementations, the thickness of any of the adhesive layers 630a and 630b can be less than about 50 microns, such as less than about 20 microns, or such as less than about 10 microns.

A first adhesive layer 630a may be positioned over the device region 610a and the edge region 610b of the substrate 610. The first adhesive layer 630a may cover the array of MEMS structures 620 in the device region 610a and be in contact with the substrate 610 in the edge region 610b. A portion of the first adhesive layer 630a may form a seal or seal ring along the edge region 610b of the substrate 610. A second adhesive layer 630b may be positioned between the moisture barrier layer 650 and the desiccant layer 640 in the device region 610a.

Figure 6B:
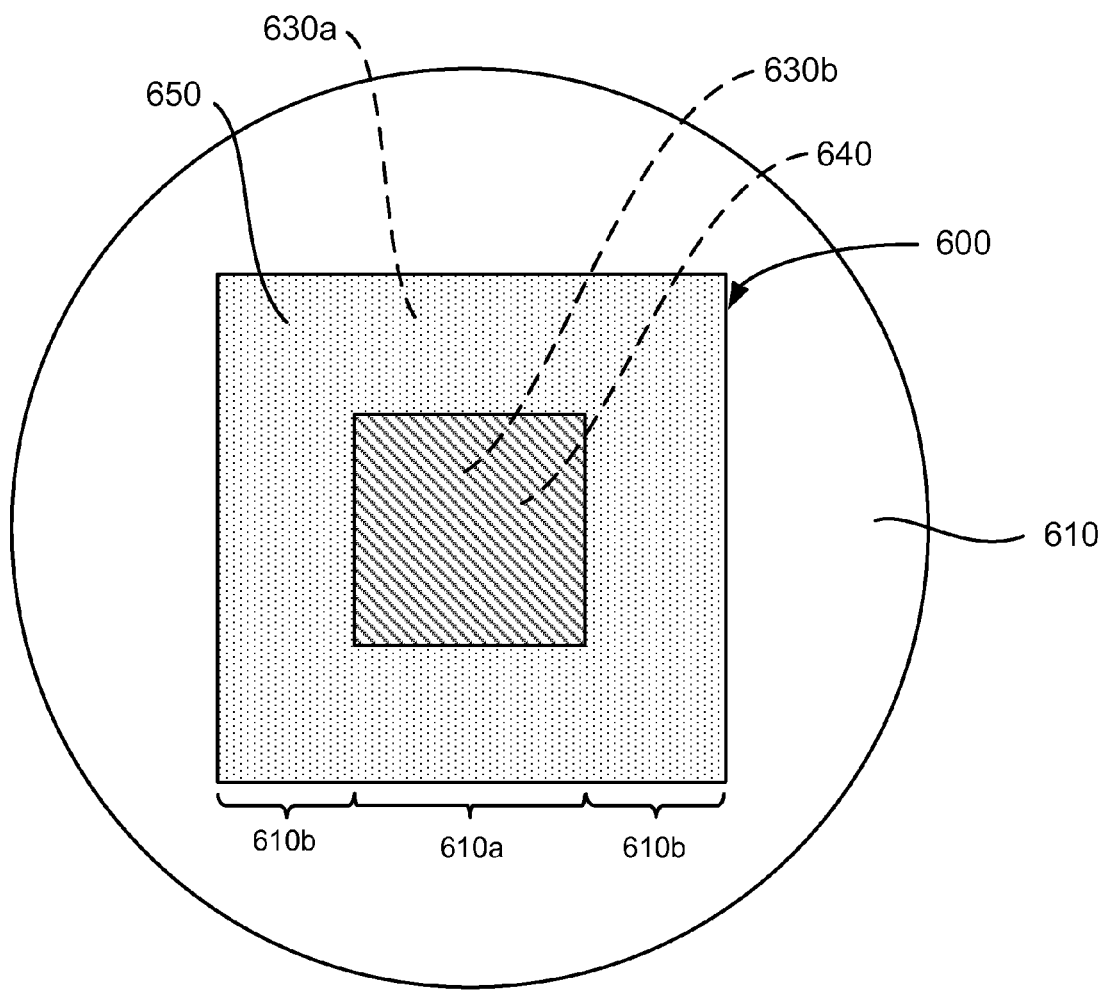
FIG. 6B shows an example of a top plan view of the multilayer laminated film on the MEMS array in FIG. 6A.

FIG. 6B shows an example of a top plan view of the multilayer laminated film on the MEMS array in FIG. 6A. In FIG. 6B, the desiccant layer 640 and the second adhesive layer 630b are over the device region 610a of the substrate 610, and the moisture barrier layer 650 and the first adhesive layer 630a are over the device region 610a and the edge region 610b of the substrate 610. The desiccant layer 640 does not cover the edge region 610b where the seal is formed. The moisture barrier layer 650 and the first adhesive layer 630a can form a perimeter or seal ring around the device region 610a of the substrate 610 to enclose the array of MEMS structures 620. The moisture barrier layer 650 and the first adhesive layer 630a in contact with the substrate 610 at the edge region 610b can form a relatively narrow border of less than about 2 mm.

In some implementations, the laminated film 600 with the plurality of layers may provide a sealant structure with increased protection against moisture ingress and outgassing than a sealant structure with an adhesive layer alone or with a combined adhesive layer and moisture barrier layer. In some implementations, the laminated film 600 may have an outgassing of less than about 1% by weight loss after 2 hours at 150° C. In some implementations, the laminated film 600 may have a permeability of water vapor of less than about $10^{-5}$ g/m$^2$/day across a 100 micron wide membrane at 40° C. and 90% humidity. In some implementations, the adhesive layers 630a and 630b at the edge region may have a permeability of water vapor of less than about 40 g/m$^2$/day across a 100 micron wide membrane (see membrane at edge region 610b in FIG. 6A) at 40° C. and 90% humidity. In some implementations, the adhesive layers 630a and 630b at the edge region may have a permeability of water vapor of less than about 10 g/m$^2$/day across a 100 micron wide membrane (see membrane at edge region 610b in FIG. 6A) at 40° C. and 90% humidity.

Use of a multilayer film structure, including a desiccant layer 640 between a moisture barrier layer 650 and a first adhesive layer 630a, can provide such increased protection against moisture ingress and outgassing. An example of a multilayer film structure having a desiccant layer between a moisture barrier layer and an adhesive layer can be found in MoistCatch™, from Kyodo Printing Co., Ltd. in Tokyo, Japan.

The laminated film 600 can be disposed over the array of MEMS structures 620 and the substrate 610 so that the thickness of the laminated film 600 is greater in the device region 610a than in the edge region 610b. For example, the laminated film 600 can include the desiccant layer 640 over the device region 610a, but not include the desiccant layer 640 in the edge region 610b, resulting in a thickness for the laminated film 600 that is lower at the edge than over the device region 610a. In other words, a ratio of the thickness at the device region 610a to the thickness at the edge region 610b is greater than 1:1. In some implementations, the thickness of the laminated film 600 at the edge region 610b can be less than about 100 microns, such as less than about 50 microns, such as less than about 30 microns, or such as between about 5 microns and about 30 microns. In some implementations, the thickness of the laminated film 600 at the device region 610a can be greater than about 100 microns, such as greater than about 50 microns, such as greater than about 30 microns, or such as between about 30 microns and about 100 microns. For example, the laminated film 600 can have a moisture barrier layer 650 having a thickness between about 10 microns and about 50 microns or 30 microns to about 50 microns, the desiccant layer 640 having a thickness between about 30 microns and about 100 microns, and the one or more adhesive layers 630 each having a thickness between about 10 micron and about 30 microns.

In some implementations, the laminated film 600 can define a seal width, which can refer to a width of the laminated film 600 spanning the edge region 610b. The laminated film 600 can provide a relatively narrow seal width. The relatively narrow seal width can allow for increased usable/viewable area in a display region of a display device. For example, the seal width can be less than about 1 mm or between about 0.5 mm and about 3 mm. In some implementations, the seal width can be wider than about 3 mm.

Figure 7:
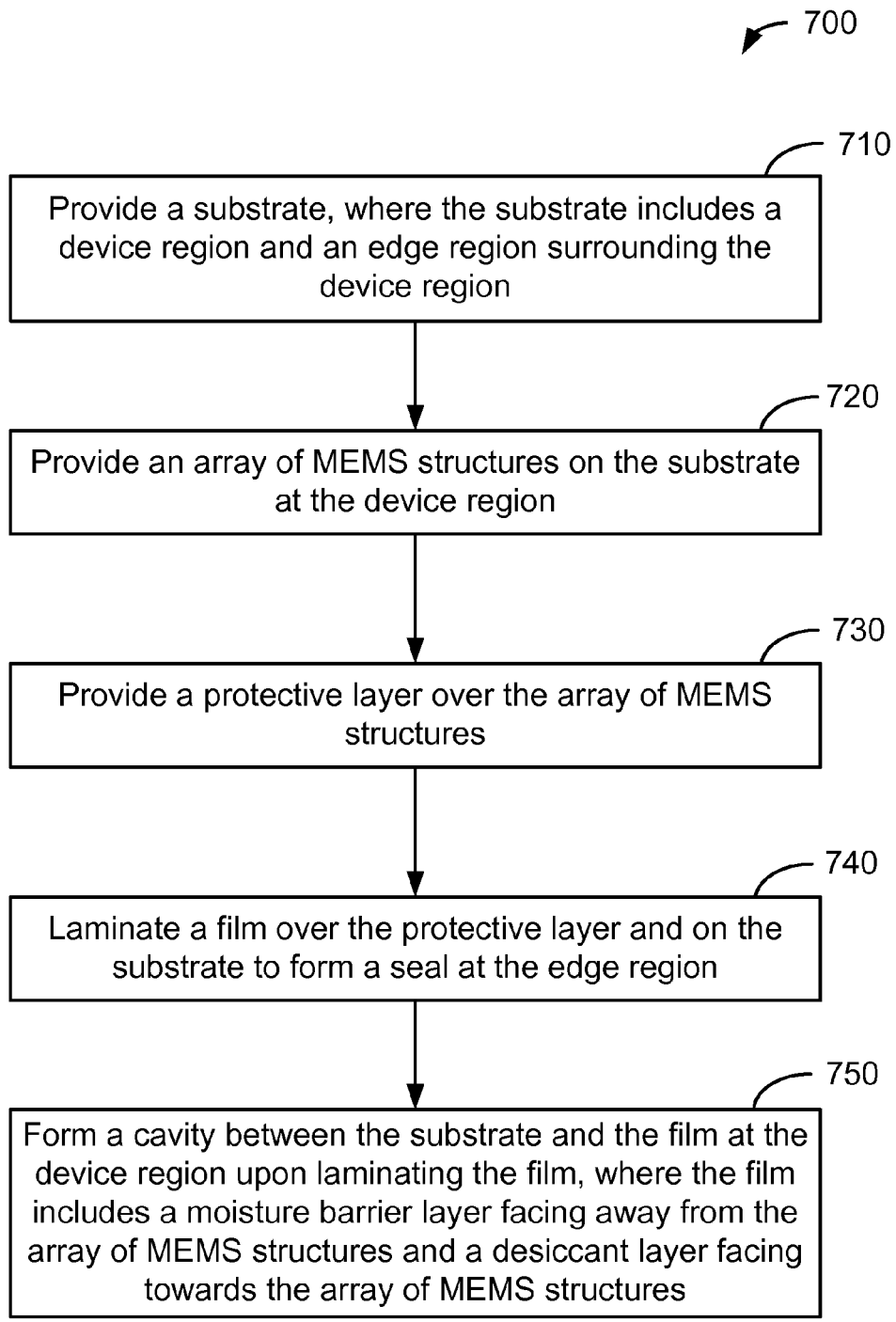
FIG. 7 shows an exemplary flow diagram of a method of manufacturing a MEMS apparatus.

FIG. 7 shows an exemplary flow diagram of a method of manufacturing a MEMS apparatus. A person having ordinary skill in the art will readily understand that additional stages not shown in FIG. 7 may also be present. For example, it will be readily understood that additional processes of depositing underlying or overlying layers, such as sacrificial layers, black mask layers, bussing layers, etc., may be present. Some implementations may perform the steps in different orders and/or with different, fewer, or additional steps than the ones shown in FIG. 7. FIG. 7 may be discussed with reference to FIGS. 8 and 9.

At block 710 of a process 700, a substrate is provided, where the substrate includes a device region and an edge region surrounding the device region. The substrate may be made of any number of different substrate materials, including transparent materials such as glass. In some implementations, the substrate may include integrated circuit, active, or passive devices formed thereon.

At block 720 of the process 700, an array of MEMS structures is provided on the substrate at the device region. Each of the MEMS structures can include a number of optical, mechanical, and electrical components. In some implementations, each of the MEMS structures can be for a reflective display element, such as an IMOD. The IMOD can be an analog or multi-state IMOD.

Forming the MEMS structures can include a series of deposition, patterning, etching, and/or planarization steps. In some implementations, the deposition steps can be performed using any suitable deposition technique, such as PVD, CVD, plasma enhanced chemical vapor deposition (PECVD), atomic layer deposition (ALD), electroplating, and spin-coating. Patterning techniques, such as photolithography, can be used to transfer patterns on a mask to a layer of material. Etching processes can be performed after patterning to remove unwanted materials.

In some implementations, forming a MEMS structure can include depositing a stationary electrode, where the stationary electrode can include an optically absorbing material. The stationary electrode may be part of an optical stack according to certain implementations. Forming the MEMS structure can further include depositing a sacrificial layer over the stationary electrode. The sacrificial layer can include but is not limited to etchable material, such as molybdenum or amorphous silicon. The thickness of the deposited sacrificial layer can correspond to the desired size of a gap to be formed upon releasing the MEMS structure. One or more tethers or hinges may be deposited and patterned over the stationary electrode and the sacrificial layer. The tethers may be formed of one or more oxides and may provide separation between the stationary electrode and a movable electrode. A movable electrode may be deposited and patterned over the tethers and over the sacrificial layer. The movable electrode may include one or more layers, including a reflective layer made of a reflective material, such as an aluminum alloy. In some implementations, another sacrificial layer may be deposited and patterned over the movable electrode before providing the protective layer over the MEMS structure. The MEMS structure is not released until removal of the sacrificial layer or layers.

At block 730 of the process 700, a protective layer over the array of MEMS structures is provided. In some implementations, the protective layer includes one or more holes extending through the protective layer. To form the protective layer, one or more layers may be deposited and patterned over the tethers as well as over the sacrificial layer or the movable electrode. The one or more layers can include a dielectric layer and/or an electrically conductive layer. The protective layer can be patterned so as to provide one or more release holes extending through the protective layer. The protective layer can include posts and ceilings to provide for a protective cavity in which the movable electrode can move after the manufacturing process is complete. In some implementations, the protective layer can be relatively thick, such as having a thickness greater than about 1 to 3 microns. Thicker protective layers are also possible. In some implementations, the protective layer can be a stack of layers, such as a dielectric layer about 0.5 to about 2.0 microns thick, a metal film about 0.5 microns thick over the first dielectric layer, and a second dielectric layer about 0.5 to about 2.0 microns thick over the metal film.

In some implementations, the sacrificial layer or layers can be removed by etching. For example, a fluorine-based etchant such as xenon difluoride ($XeF_2$) can be introduced through the release holes of the protective layer to remove sacrificial layer or layers in the MEMS structure. Upon etching the sacrificial layer or layers, the MEMS structure is released and a gap can be formed between the movable electrode and the stationary electrode. In some implementations, another gap may be formed between the movable electrode and the protective layer.

In some implementations, a cap may be deposited and patterned over the protective layer. The cap may plug up the release holes in the protective layer. In some implementations, the cap may provide additional thickness for increased structural rigidity to the protective layer. The cap may be made of a dielectric material.

At block 740, a film is laminated over the protective layer and on the substrate to form a seal at the edge region. In some implementations, laminating the film can include laminating the film directly on the protective layer. The lamination can be in contact with a cap where the cap serves to plug a release hole, or the lamination can plug the release hole itself. In some implementations, laminating the film can include laminating the film over the protective layer to form air gaps or air bubbles between the film and the protective layer.

Figure 8:
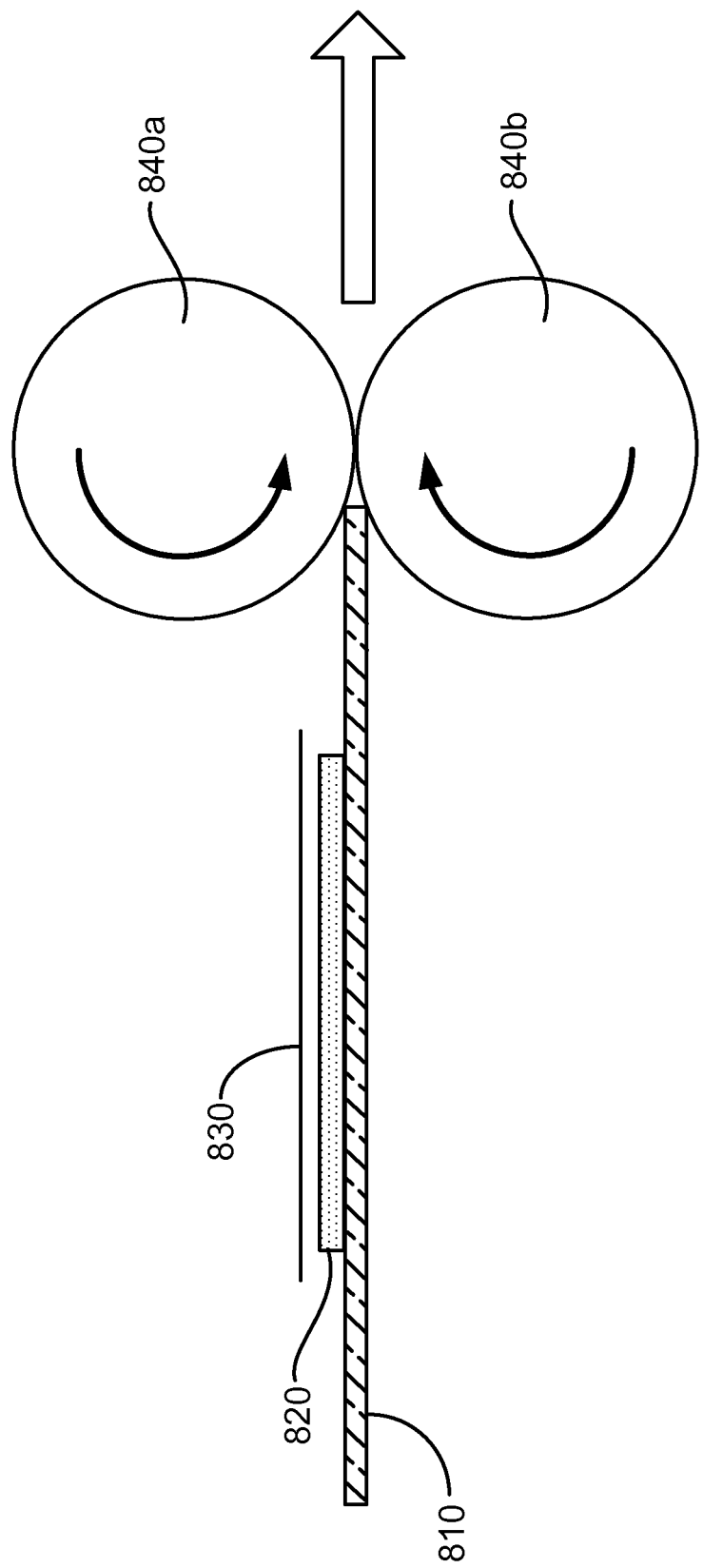
FIG. 8 shows an example of a cross-sectional schematic illustration of manufacturing equipment for laminating a film over a MEMS array, according to some implementations.

FIG. 8 shows an example of a cross-sectional schematic illustration of manufacturing equipment for laminating a film over a MEMS array, according to some implementations. In some implementations, a film 830 can be laminated using a hot roll laminator 800. The hot roll laminator 800 can include first and second rollers 840a and 840b. In some implementations, the first and second rollers 840a and 840b can be made of rubber. Other materials such as silicon can be used. During operation, the first and second rollers 840a and 840b are heated and rotated. The first and second rollers 840a and 840b rotate in opposite directions, as indicated by the arrows, to pull a substrate 810 through. The substrate 810 can include an array of MEMS structures 820 formed thereon.

As the substrate 810 is pulled through the first and second rollers 840a and 840b, a film 830 is heated and compressed onto the surface of the array of MEMS structures 820. The pressure exerted by the first and second rollers 840a and 840b may be configured to facilitate sealing of the array of MEMS structures 820 without crushing or damaging the MEMS structures 820. The speed of the first and second rollers 840a and 840b can be adjusted to ensure complete lamination of the film 830 for sealing the array of MEMS structures 820. The lamination process as shown in FIG. 8 can be configured to provide continuous processing to increase throughput and reduce costs.

However, in some instances, equipment for lamination can apply pressure on one or more MEMS structures in a manner that can damage the one or more MEMS structures. For example, in FIG. 8, as the substrate 810 is pulled through the first and second rollers 840a and 840b, some of the MEMS structures 820 may be crushed or otherwise damaged. The first and second rollers 840a and 840b may not be able to consistently control the applied pressure on the substrate 810.

To distribute the applied pressure on the MEMS structures 820 and reduce the likelihood of damage to the MEMS structures 820, a pitch between each of the MEMS structures can be reduced or a thickness of a protective layer and/or cap of each of the MEMS structures can be increased. In some implementations, the pitch between each of the MEMS structures can be between about 20 microns and about 80 microns. In some implementations, the thickness of the protective layer can be greater than 1 to 3 microns.

Pressure on the MEMS structures in active areas can be reduced by patterning the rollers. FIG. 9A shows an example of a cross-sectional schematic illustration of a hot roll laminator for laminating a film over a MEMS array, according to some implementations. To better control pressure, a hot roll laminator 900 with a roller 940 may be designed with recesses 950. The recesses 950 may be patterned onto a plate held by the roller 940. A film 930 may be wrapped around the roller 940 and unwound to be laminated on the substrate 910. The recesses 950 may be selectively positioned so that the roller 940 applies pressure on non-active areas 920b of a substrate 910 and applies little to no pressure on active areas 920a of the substrate 910. The hardness of the roller 940 and the depth of the recesses 950 can adjust the amount of pressure exerted by the roller 940. As a result, pressure exerted from the roller 940 may be reduced on MEMS structures in the active area 920a of the substrate 910 so that they are less likely to be crushed or otherwise damaged.

Figure 9B:
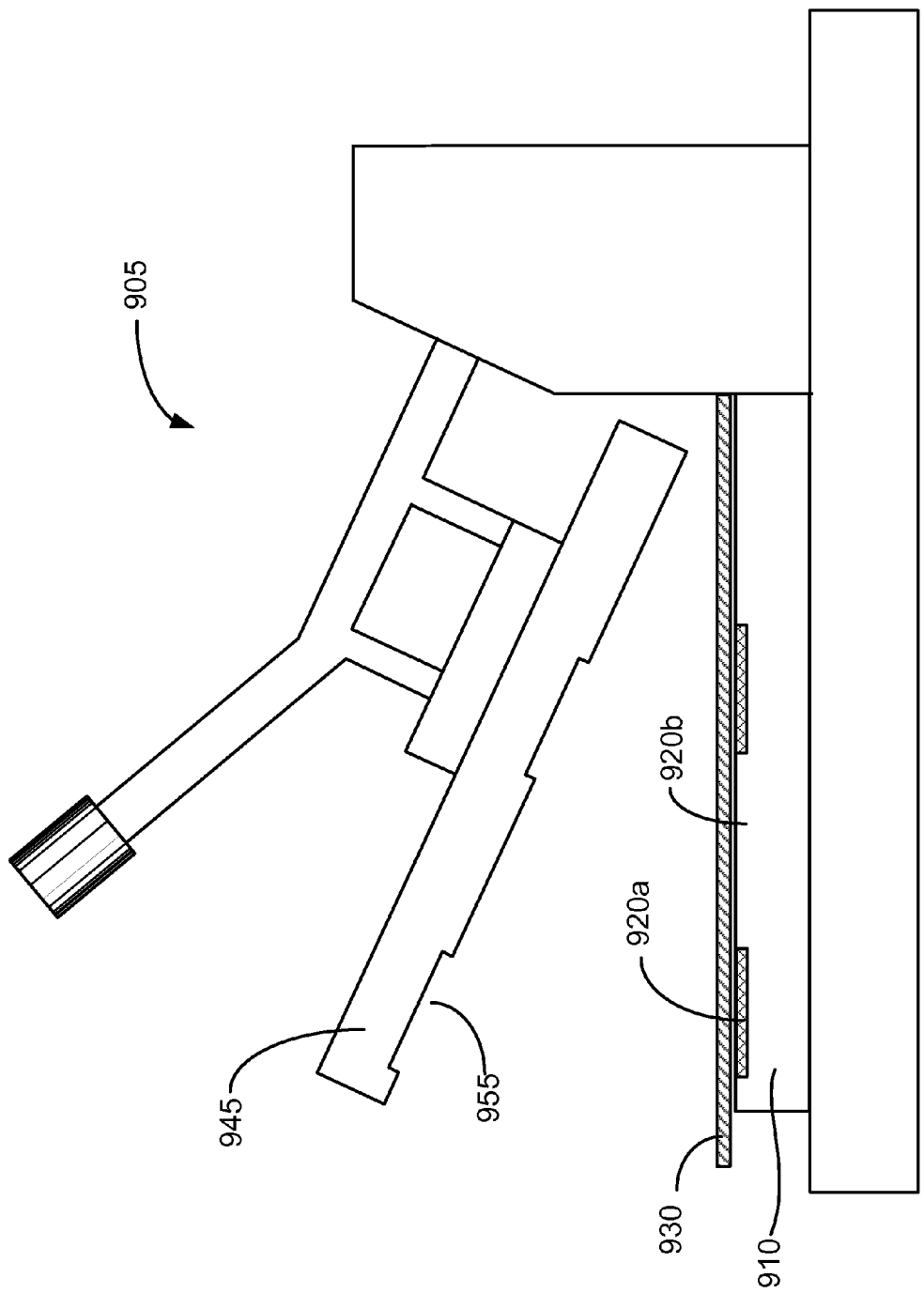
FIG. 9B shows an example of a cross-sectional schematic illustration of a heat press laminator for laminating a film over a MEMS array, according to some implementations.

FIG. 9B shows an example of a cross-sectional schematic illustration of a heat press laminator for laminating a film over a MEMS array, according to some implementations. To instantaneously apply pressure to a film 930, a heat press laminator 905 can include a heat press 945 with one or more recesses 955. The recesses 955 may be arranged so as to apply pressure at non-active areas 920b of the substrate 910, and apply little to no pressure at active areas 920a of the substrate 910. The applied pressure can laminate the film 930 onto the MEMS array without crushing or otherwise damaging MEMS structures in the active areas 920a of the substrate 910. The heat press laminator 905 can behave like a stamp with cutouts to laminate the film onto the substrate 910.

In some implementations, a hot roll laminator or a heat press laminator having recesses such as described in FIGS. 9A and 9B can encapsulate an array of MEMS structures on a substrate to form air gaps or air bubbles between a protective layer and a laminated film. The laminated film may avoid contact with the protective layer over the MEMS structure. Consequently, the laminated film may leave the release holes unplugged in the protective layer over the MEMS structure.

In some implementations, laminating a film over a MEMS array can be performed using vacuum lamination. A substrate with an array of MEMS structures may be placed in a chamber in which the air is pumped out. When the air is pumped out of the chamber, a film may be pressed directly onto the array of MEMS structures or onto a protective layer due to a pressure differential. Accordingly, the film may be laminated directly on the array of MEMS structures or on the protective layer to enclose the array of MEMS structures.

Returning to FIG. 7, at block 750 of the process 700, a cavity between the substrate and the film at the device region is formed upon laminating the film, where the film includes a moisture barrier layer facing away from the array of MEMS structures and a desiccant layer facing toward the array of MEMS structures. In some implementations, the cavity between the substrate and the film at the device region can include the gap formed between the stationary electrode and the movable electrode of each of the MEMS structures, as well as the gap formed between the movable electrode and the protective layer of each of the MEMS structures upon release.

The film can be a multilayer film further including an adhesive layer. At least a portion of the adhesive layer can contact the substrate to form the seal at the edge region. The desiccant layer can extend continuously across the device region up to the edge region of the substrate. In some implementations, the process 700 can include patterning the film prior to lamination so that the thickness of the film when laminated at the device region is greater than the thickness of the film when laminated at the edge region of the substrate.

Figure 10A:
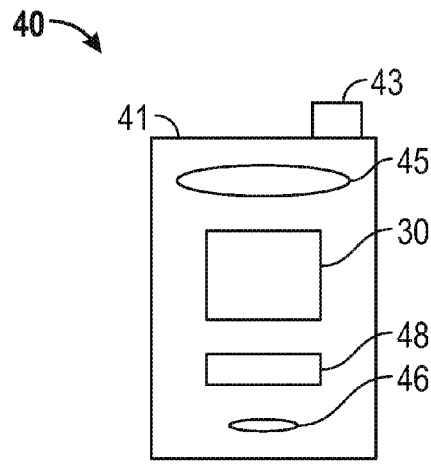
FIGS. 10A and 10B are system block diagrams illustrating a display device that includes a plurality of IMOD display elements.
Figure 10B:
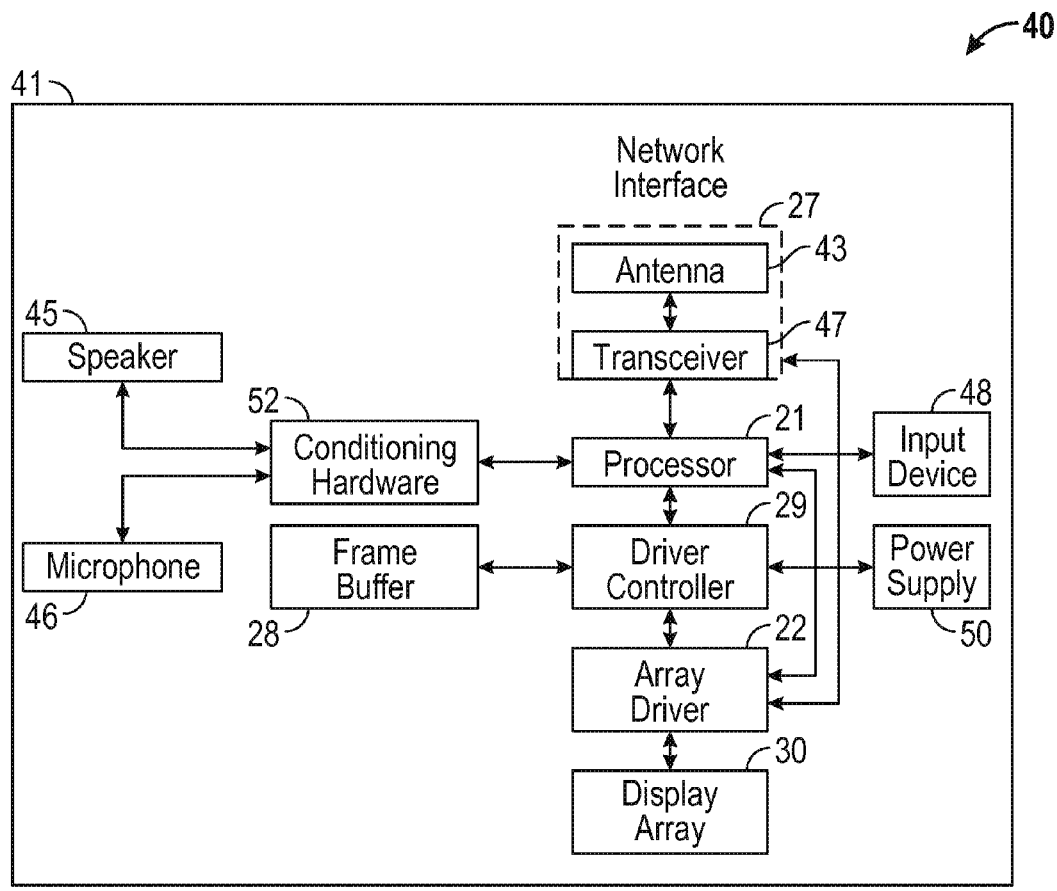

FIGS. 10A and 10B are system block diagrams illustrating a display device 40 that includes a plurality of IMOD display elements. The display device 40 can be, for example, a smart phone, a cellular or mobile telephone. However, the same components of the display device 40 or slight variations thereof are also illustrative of various types of display devices such as televisions, computers, tablets, e-readers, hand-held devices and portable media devices.

The display device 40 includes a housing 41, a display 30, an antenna 43, a speaker 45, an input device 48 and a microphone 46. The housing 41 can be formed from any of a variety of manufacturing processes, including injection molding, and vacuum forming. In addition, the housing 41 may be made from any of a variety of materials, including, but not limited to: plastic, metal, glass, rubber and ceramic, or a combination thereof. The housing 41 can include removable portions (not shown) that may be interchanged with other removable portions of different color, or containing different logos, pictures, or symbols.

The display 30 may be any of a variety of displays, including a bi-stable or analog display, as described herein. The display 30 also can be configured to include a flat-panel display, such as plasma, EL, OLED, STN LCD, or TFT LCD, or a non-flat-panel display, such as a CRT or other tube device. In addition, the display 30 can include an IMOD-based display, as described herein.

The components of the display device 40 are schematically illustrated in FIG. 10A. The display device 40 includes a housing 41 and can include additional components at least partially enclosed therein. For example, the display device 40 includes a network interface 27 that includes an antenna 43 which can be coupled to a transceiver 47. The network interface 27 may be a source for image data that could be displayed on the display device 40. Accordingly, the network interface 27 is one example of an image source module, but the processor 21 and the input device 48 also may serve as an image source module. The transceiver 47 is connected to a processor 21, which is connected to conditioning hardware 52. The conditioning hardware 52 may be configured to condition a signal (such as filter or otherwise manipulate a signal). The conditioning hardware 52 can be connected to a speaker 45 and a microphone 46. The processor 21 also can be connected to an input device 48 and a driver controller 29. The driver controller 29 can be coupled to a frame buffer 28, and to an array driver 22, which in turn can be coupled to a display array 30. One or more elements in the display device 40, including elements not specifically depicted in FIG. 10A, can be configured to function as a memory device and be configured to communicate with the processor 21. In some implementations, a power supply 50 can provide power to substantially all components in the particular display device 40 design.

The network interface 27 includes the antenna 43 and the transceiver 47 so that the display device 40 can communicate with one or more devices over a network. The network interface 27 also may have some processing capabilities to relieve, for example, data processing requirements of the processor 21. The antenna 43 can transmit and receive signals. In some implementations, the antenna 43 transmits and receives RF signals according to the IEEE 16.11 standard, including IEEE 16.11(a), (b), or (g), or the IEEE 802.11 standard, including IEEE 802.11a, b, g, n, and further implementations thereof. In some other implementations, the antenna 43 transmits and receives RF signals according to the Bluetooth® standard. In the case of a cellular telephone, the antenna 43 can be designed to receive code division multiple access (CDMA), frequency division multiple access (FDMA), time division multiple access (TDMA), Global System for Mobile communications (GSM), GSM/General Packet Radio Service (GPRS), Enhanced Data GSM Environment (EDGE), Terrestrial Trunked Radio (TETRA), Wideband-CDMA (W-CDMA), Evolution Data Optimized (EV-DO), 1xEV-DO, EV-DO Rev A, EV-DO Rev B, High Speed Packet Access (HSPA), High Speed Downlink Packet Access (HSDPA), High Speed Uplink Packet Access (HSUPA), Evolved High Speed Packet Access (HSPA+), Long Term Evolution (LTE), AMPS, or other known signals that are used to communicate within a wireless network, such as a system utilizing 3G, 4G or 5G technology. The transceiver 47 can preprocess the signals received from the antenna 43 so that they may be received by and further manipulated by the processor 21. The transceiver 47 also can process signals received from the processor 21 so that they may be transmitted from the display device 40 via the antenna 43.

In some implementations, the transceiver 47 can be replaced by a receiver. In addition, in some implementations, the network interface 27 can be replaced by an image source, which can store or generate image data to be sent to the processor 21. The processor 21 can control the overall operation of the display device 40. The processor 21 receives data, such as compressed image data from the network interface 27 or an image source, and processes the data into raw image data or into a format that can be readily processed into raw image data. The processor 21 can send the processed data to the driver controller 29 or to the frame buffer 28 for storage. Raw data typically refers to the information that identifies the image characteristics at each location within an image. For example, such image characteristics can include color, saturation and gray-scale level.

The processor 21 can include a microcontroller, CPU, or logic unit to control operation of the display device 40. The conditioning hardware 52 may include amplifiers and filters for transmitting signals to the speaker 45, and for receiving signals from the microphone 46. The conditioning hardware 52 may be discrete components within the display device 40, or may be incorporated within the processor 21 or other components.

The driver controller 29 can take the raw image data generated by the processor 21 either directly from the processor 21 or from the frame buffer 28 and can re-format the raw image data appropriately for high speed transmission to the array driver 22. In some implementations, the driver controller 29 can re-format the raw image data into a data flow having a raster-like format, such that it has a time order suitable for scanning across the display array 30. Then the driver controller 29 sends the formatted information to the array driver 22. Although a driver controller 29, such as an LCD controller, is often associated with the system processor 21 as a stand-alone Integrated Circuit (IC), such controllers may be implemented in many ways. For example, controllers may be embedded in the processor 21 as hardware, embedded in the processor 21 as software, or fully integrated in hardware with the array driver 22.

The array driver 22 can receive the formatted information from the driver controller 29 and can re-format the video data into a parallel set of waveforms that are applied many times per second to the hundreds, and sometimes thousands (or more), of leads coming from the display's x-y matrix of display elements.

In some implementations, the driver controller 29, the array driver 22, and the display array 30 are appropriate for any of the types of displays described herein. For example, the driver controller 29 can be a conventional display controller or a bi-stable display controller (such as an IMOD display element controller). Additionally, the array driver 22 can be a conventional driver or a bi-stable display driver (such as an IMOD display element driver). Moreover, the display array 30 can be a conventional display array or a bi-stable display array (such as a display including an array of IMOD display elements). In some implementations, the driver controller 29 can be integrated with the array driver 22. Such an implementation can be useful in highly integrated systems, for example, mobile phones, portable-electronic devices, watches or small-area displays.

In some implementations, the input device 48 can be configured to allow, for example, a user to control the operation of the display device 40. The input device 48 can include a keypad, such as a QWERTY keyboard or a telephone keypad, a button, a switch, a rocker, a touch-sensitive screen, a touch-sensitive screen integrated with the display array 30, or a pressure- or heat-sensitive membrane. The microphone 46 can be configured as an input device for the display device 40. In some implementations, voice commands through the microphone 46 can be used for controlling operations of the display device 40.

The power supply 50 can include a variety of energy storage devices. For example, the power supply 50 can be a rechargeable battery, such as a nickel-cadmium battery or a lithium-ion battery. In implementations using a rechargeable battery, the rechargeable battery may be chargeable using power coming from, for example, a wall socket or a photo-voltaic device or array. Alternatively, the rechargeable battery can be wirelessly chargeable. The power supply 50 also can be a renewable energy source, a capacitor, or a solar cell, including a plastic solar cell or solar-cell paint. The power supply 50 also can be configured to receive power from a wall outlet.

In some implementations, control programmability resides in the driver controller 29 which can be located in several places in the electronic display system. In some other implementations, control programmability resides in the array driver 22. The above-described optimization may be implemented in any number of hardware and/or software components and in various configurations.

As used herein, a phrase referring to "at least one of" a list of items refers to any combination of those items, including single members. As an example, "at least one of: a, b, or c" is intended to cover: a, b, c, a-b, a-c, b-c, and a-b-c.

The various illustrative logics, logical blocks, modules, circuits and algorithm steps described in connection with the implementations disclosed herein may be implemented as electronic hardware, computer software, or combinations of both. The interchangeability of hardware and software has been described generally, in terms of functionality, and illustrated in the various illustrative components, blocks, modules, circuits and steps described above. Whether such functionality is implemented in hardware or software depends upon the particular application and design constraints imposed on the overall system.

The hardware and data processing apparatus used to implement the various illustrative logics, logical blocks, modules and circuits described in connection with the aspects disclosed herein may be implemented or performed with a general purpose single- or multi-chip processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, or, any conventional processor, controller, microcontroller, or state machine. A processor also may be implemented as a combination of computing devices, such as a combination of a DSP and a microprocessor, a plurality of microprocessors, one or more microprocessors in conjunction with a DSP core, or any other such configuration. In some implementations, particular steps and methods may be performed by circuitry that is specific to a given function.

In one or more aspects, the functions described may be implemented in hardware, digital electronic circuitry, computer software, firmware, including the structures disclosed in this specification and their structural equivalents thereof, or in any combination thereof. Implementations of the subject matter described in this specification also can be implemented as one or more computer programs, i.e., one or more modules of computer program instructions, encoded on a computer storage media for execution by, or to control the operation of, data processing apparatus.

Various modifications to the implementations described in this disclosure may be readily apparent to those skilled in the art, and the generic principles defined herein may be applied to other implementations without departing from the spirit or scope of this disclosure. Thus, the claims are not intended to be limited to the implementations shown herein, but are to be accorded the widest scope consistent with this disclosure, the principles and the novel features disclosed herein. Additionally, a person having ordinary skill in the art will readily appreciate, the terms "upper" and "lower" are sometimes used for ease of describing the figures, and indicate relative positions corresponding to the orientation of the figure on a properly oriented page, and may not reflect the proper orientation of, e.g., an IMOD display element as implemented.

Certain features that are described in this specification in the context of separate implementations also can be implemented in combination in a single implementation. Conversely, various features that are described in the context of a single implementation also can be implemented in multiple implementations separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, a person having ordinary skill in the art will readily recognize that such operations need not be performed in the particular order shown or in sequential order, or that all illustrated operations be performed, to achieve desirable results. Further, the drawings may schematically depict one more example processes in the form of a flow diagram. However, other operations that are not depicted can be incorporated in the example processes that are schematically illustrated. For example, one or more additional operations can be performed before, after, simultaneously, or between any of the illustrated operations. In certain circumstances, multitasking and parallel processing may be advantageous. Moreover, the separation of various system components in the implementations described above should not be understood as requiring such separation in all implementations, and it should be understood that the described program components and systems can generally be integrated together in a single software product or packaged into multiple software products. Additionally, other implementations are within the scope of the following claims. In some cases, the actions recited in the claims can be performed in a different order and still achieve desirable results.

What is claimed is:

1. An microelectromechanical systems (MEMS) apparatus comprising:
   a substrate having a device region and an edge region surrounding the device region;
   an array of MEMS structures on the substrate in the device region;
   a protective layer over the array of MEMS structures; and
   a laminated film over the protective layer and in contact with the substrate to form a seal in the edge region, the laminated film forming a cavity between the substrate and the laminated film in the device region, wherein the laminated film is thicker in the device region than in the edge region, and wherein the laminated film includes:
      a moisture barrier layer facing away from the array of MEMS structures; and
      a desiccant layer facing toward the array of MEMS structures and extending continuously across an entirety of the array of MEMS structures in the device region.

2. The apparatus of claim 1, wherein the laminated film defines an air gap between the laminated film and the protective layer.

3. The apparatus of claim 1, wherein the laminated film is directly on the protective layer.

4. The apparatus of claim 3, wherein the protective layer includes one or more holes extending through the protective layer, wherein the laminated film covers the one or more holes.

5. The apparatus of claim 1, wherein a pitch between each of the MEMS structures is between about 20 microns and about 80 microns.

6. The apparatus of claim 1, wherein the laminated film has a thickness greater than about 30 microns at the device region of the substrate, and has a thickness less than about 30 microns at the edge region of the substrate.

7. The apparatus of claim 1, wherein the laminated film does not include a desiccant layer at the edge region of the substrate.

8. The apparatus of claim 1, wherein the laminated film further includes one or more adhesive layers, wherein at least part of the one or more adhesive layers is in contact with the substrate at the edge region.

9. The apparatus of claim 8, wherein the laminated film has an outgassing of less than about 1% by weight loss after 2 hours at 150° C.

10. The apparatus of claim 8, wherein the adhesive layers at the edge region have a permeability of water vapor of less than about 40 $g/m^2$/day across a 100 micron wide seal at 40° C. and 90% humidity.

11. The apparatus of claim 1, wherein the protective layer has a thickness of greater than about 1 micron.

12. The apparatus of claim 1, wherein each of the MEMS structures includes:
   a stationary electrode over the substrate;
   a movable electrode over the stationary electrode; and
   a gap between the stationary electrode and the movable electrode.

13. The apparatus of claim 1, wherein the laminated film and the substrate enclose the array of MEMS structures to form a MEMS device package without a cover plate.

14. An microelectromechanical systems (MEMS) apparatus comprising:
   a substrate having a device region and an edge region surrounding the device region;
   an array of MEMS structures on the substrate in the device region;
   means for protecting the MEMS structures over the array of MEMS structures; and
   means for sealing by lamination over the protecting means and in contact with the substrate in the edge region, the sealing means forming a cavity between the sealing means and the substrate in the device region, wherein the sealing means is thicker in the device region than in the edge region, and wherein the sealing means includes:
      means for limiting passage of moisture facing away from the array of MEMS structures; and
      means for removing moisture facing toward the array of MEMS structures and extending continuously across an entirety of the array of MEMS structures in the device region.

15. The apparatus of claim 14, wherein the sealing means defines an air gap between the sealing means and the protecting means.

16. The apparatus of claim 14, wherein the sealing means is directly on the protecting means.

17. The apparatus of claim 1, wherein the laminated film includes:
   a first adhesive layer between the substrate and the desiccant layer, the first adhesive layer over an entirety of the array of MEMS structures in the device region and in contact with the substrate at the edge region; and
   a second adhesive layer, wherein the desiccant layer is between the second adhesive layer and the first adhesive layer.

18. An microelectromechanical systems (MEMS) apparatus comprising:
   a substrate having a device region and an edge region surrounding the device region;
   an array of MEMS structures on the substrate at the device region;
   a protective layer over the array of MEMS structures; and
   a laminated film over the protective layer and in contact with the substrate to form a seal in the edge region, the laminated film forming a cavity between the substrate and the laminated film in the device region, wherein the laminated film has a thickness greater than about 30 microns in the device region of the substrate, and has a thickness less than about 30 microns in the edge region of the substrate, and wherein the laminated film includes:
a moisture barrier layer facing away from the array of MEMS structures; and
a desiccant layer facing toward the array of MEMS structures.

* * * * *